(12) United States Patent
Minshall et al.

(10) Patent No.: US 10,115,608 B2
(45) Date of Patent: Oct. 30, 2018

(54) METHOD AND APPARATUS FOR RAPID PUMP-DOWN OF A HIGH-VACUUM LOADLOCK

(71) Applicant: Novellus Systems, Inc., Fremont, CA (US)

(72) Inventors: Edmund B. Minshall, Sherwood, OR (US); Victor F. Morris, San Jose, CA (US); Ram Charan, Bangalore (IN); Ronald A. Powell, Portola Valley, CA (US); Mukul Khosla, San Jose, CA (US)

(73) Assignee: Novellus Systems, Inc., Fremont, CA (US)

(*) Notice: Subject to any disclaimer, the term of this patent is extended or adjusted under 35 U.S.C. 154(b) by 578 days.

(21) Appl. No.: 13/901,000

(22) Filed: May 23, 2013

(65) Prior Publication Data

US 2013/0312835 A1 Nov. 28, 2013

Related U.S. Application Data

(60) Provisional application No. 61/651,942, filed on May 25, 2012.

(51) Int. Cl.
*H01L 21/67* (2006.01)

(52) U.S. Cl.
CPC .. *H01L 21/67011* (2013.01); *H01L 21/67201* (2013.01); *Y10T 137/0379* (2015.04); *Y10T 137/7781* (2015.04)

(58) Field of Classification Search
CPC ......... H01L 21/67011; H01L 21/67201; Y10T 137/0379; Y10T 137/7781

USPC ............ 137/12, 494; 414/939; 454/184, 333
See application file for complete search history.

(56) References Cited

U.S. PATENT DOCUMENTS

| | | | | |
|---|---|---|---|---|
| 5,449,276 A | * | 9/1995 | Maruyama ............... | F04C 18/16 417/205 |
| 5,782,609 A | * | 7/1998 | Ikemoto ............... | F04C 29/0085 417/199.2 |
| 6,083,566 A | * | 7/2000 | Whitesell ............... | C23C 14/566 118/695 |
| 6,497,734 B1 | * | 12/2002 | Barber ............... | H01L 21/67017 29/25.01 |
| 2003/0051815 A1 | * | 3/2003 | Kosuda ................ | C23C 14/566 156/345.31 |
| 2004/0118812 A1 | * | 6/2004 | Watkins .................... | C23F 1/16 216/83 |

(Continued)

*Primary Examiner* — Gregory Huson
*Assistant Examiner* — Frances F Hamilton
(74) *Attorney, Agent, or Firm* — Weaver Austin Villeneuve & Sampson LLP

(57) ABSTRACT

A gas expansion module for use with semiconductor wafer loadlocks and other regulated-pressure components of semiconductor processing tools is provided. The gas expansion module may be barometrically isolated from the loadlock or other component and pumped down to a vacuum condition while the loadlock is performing operations at a higher pressure, such as ambient atmospheric conditions. After an initial pump-down of the loadlock is performed, the gas expansion module may be fluidly joined to the loadlock volume and the gases within each allowed to reach equilibrium. A further pump-down of the combined volume may be used to bring the loadlock pressure to a desired vacuum condition.

13 Claims, 17 Drawing Sheets

(56) References Cited

U.S. PATENT DOCUMENTS

| | | | |
|---|---|---|---|
| 2005/0045276 A1* | 3/2005 | Patel | B81C 1/00476 156/345.43 |
| 2005/0092251 A1* | 5/2005 | Kosuda | C23C 14/566 118/719 |
| 2006/0003671 A1* | 1/2006 | Stumpf | B24B 37/345 451/5 |
| 2006/0176928 A1* | 8/2006 | Nakamura | H01L 21/67017 373/60 |
| 2008/0181750 A1* | 7/2008 | Moriya | H01L 21/67126 414/217.1 |
| 2009/0016855 A1* | 1/2009 | Hofmeister | H01L 21/67126 414/220 |
| 2009/0191340 A1* | 7/2009 | Tozawa | H01L 21/02063 427/255.39 |
| 2010/0055314 A1* | 3/2010 | Kato | C23C 16/45551 427/255.28 |
| 2011/0242508 A1* | 10/2011 | Kobayashi | H01L 21/67109 355/27 |
| 2012/0244715 A1* | 9/2012 | Lebouitz | H01L 21/3065 438/706 |

* cited by examiner

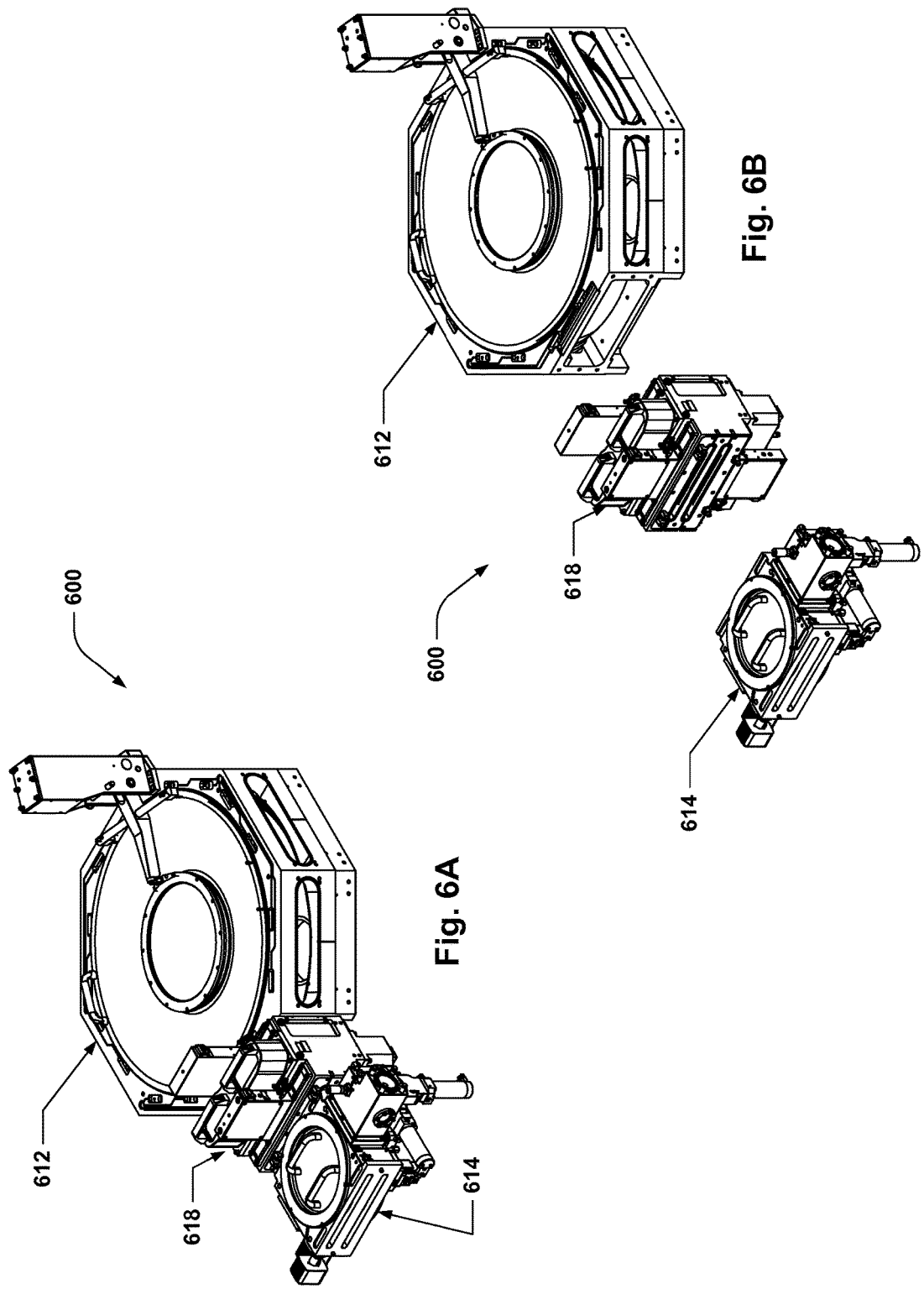

METHOD AND APPARATUS FOR RAPID PUMP-DOWN OF A HIGH-VACUUM LOADLOCK

CROSS-REFERENCE TO RELATED APPLICATIONS

This application claims benefit under 35 U.S.C. § 119(e) to U.S. Provisional Application No. 61/651,942, filed May 25, 2012, titled "METHOD AND APPARATUS FOR RAPID PUMP-DOWN OF A HIGH-VACUUM LOAD LOCK" which is hereby incorporated by reference herein in its entirety.

BACKGROUND

Semiconductor processes are often performed in vacuum environments and often use potentially harmful and/or corrosive chemicals. As such, semiconductor processing tools often include one or more sealed internal volumes that can be pressure-regulated to achieve the desired pressure environments. To facilitate loading and unloading of semiconductor wafers into the semiconductor processing tools without requiring that the entire internal volume of the tool be brought to atmospheric conditions, semiconductor processing tools may use a loadlock, which is a form of airlock. Loadlocks may also quarantine the internal volume of the tool from the outside environment thereby preventing diffusion of toxic chemicals into the fabrication facility's ambient environment where such chemicals may come into contact with human operators. Loadlocks also mitigate or prevent contamination of the process volumes with particulates from the ambient facility environment.

SUMMARY

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

In some implementations, an apparatus may be provided that is configured for use with a semiconductor processing tool having a chamber and a loadlock with a loadlock volume. The apparatus may include a gas expansion volume that is, or is operably configurable to be, at least one and half times larger than the loadlock volume and a gas expansion volume valve. The gas expansion volume may be configured to connect with the loadlock such that the gas expansion volume valve is interposed between the loadlock volume and the gas expansion volume when so connected. The gas expansion volume valve may be configured to be movable between an open state and a closed state, and the gas expansion volume valve may permit fluidic communication between the loadlock volume and the gas expansion volume when in the open state prevent fluidic communication between the loadlock volume and the gas expansion volume when in the closed state. The apparatus may further include a first mechanism that is fluidly connected with the gas expansion volume, configured to control gas pressure within the gas expansion volume, and fluidly isolated from the loadlock volume when the gas expansion volume valve is in the closed state.

In some further implementations, the apparatus may further include a chamber valve and the gas expansion volume may be configured to connect with the chamber such that the chamber valve is interposed between the gas expansion volume and the chamber when so connected and such that gas flowing from the chamber to the loadlock volume must pass through at least part of the gas expansion volume before reaching the loadlock volume.

In some further implementations, the first mechanism may include a turbopump configured to evacuate gas from the gas expansion volume. In some alternative or further implementations, the first mechanism may further include a cryopump configured to condense gas within the gas expansion volume.

In some implementations, the first mechanism may include a movable surface that partially defines the gas expansion volume and an actuator configured to move the movable surface. In such implementations, movement of the movable surface may cause the gas expansion volume to increase or decrease in size and the gas expansion volume may be at least one and a half times as large as the loadlock volume for at least one operating position of the actuator.

In some implementations, the apparatus may include a controller with at least one processor and a memory, the memory storing computer-executable instructions for controlling the at least one processor to: a) control the gas expansion volume valve and the chamber valve to enter the closed state; b) control, after (a), a loadlock valve associated with the loadlock to enter an open state to allow a semiconductor wafer to be placed within the loadlock volume and to enter a closed state after the semiconductor wafer has been placed within the loadlock volume; c) control, after (b), a second mechanism to reduce gas pressure in the loadlock volume to a first low pressure; d) control, after (a), the first mechanism to reduce gas pressure in the gas expansion volume to a second low pressure lower than the first low pressure; e) control, after (c) and (d), the gas expansion volume valve to enter the open state, thereby allowing gas in the gas expansion volume to mix with gas from the loadlock volume and reach equilibrium at a third low pressure between the first low pressure and the second low pressure; and f) control, after (e), the chamber valve to enter the open state.

In some such implementations, the first mechanism may include a movable surface that partially defines the gas expansion volume and an actuator configured to move the movable surface and the memory may further store computer-executable instructions for controlling the at least one processor to perform (d) by actuating the actuator and moving the movable surface to increase the size of the gas expansion volume to at least one and a half times the loadlock volume. In such implementations, movement of the movable surface may cause the gas expansion volume to increase or decrease in size and the gas expansion volume may be at least one and a half times as large as the loadlock volume for at least one operating position of the actuator.

In some implementations of the apparatus, the first low pressure may be lower than about 10E-6 Torr and the second low pressure may be between about 10 Torr and 1 milliTorr.

In some implementations, an apparatus may be provided. The apparatus may include a loadlock volume; a gas expansion volume that is configured to be or is operably configurable to be at least one and a half times larger than the loadlock volume; a chamber port; a gas expansion volume valve interposed between the loadlock volume and the gas expansion volume; and a chamber valve. In such implementations, the gas expansion volume valve and the chamber valve may be configured such that the loadlock volume, the gas expansion volume, and the chamber port are fluidly connected with one another when the gas expansion volume valve and the chamber valve are in an open state and the loadlock volume, the gas expansion volume, and the chamber port are sealed off from one another when the gas expansion volume valve and the chamber valve are in a closed state.

In some such implementations of the apparatus, the chamber valve may be interposed between the chamber port and the gas expansion volume such that gas flowing from the chamber port to the loadlock volume must pass through the gas expansion volume before reaching the loadlock volume.

In some implementations of the apparatus, the chamber valve may be interposed between the chamber port and the loadlock volume such that gas flowing from the chamber port to the gas expansion volume must pass through the loadlock volume before reaching the gas expansion volume.

In some implementations of the apparatus, the apparatus may further include a loadlock valve interposed between the loadlock volume and an interface configured to receive a semiconductor wafer from an external source; a first mechanism configured to control pressure in the gas expansion volume; a second mechanism configured to control pressure in the loadlock volume; and a controller with at least one processor and a memory. The memory may store computer-executable instructions for controlling the at least one processor to: a) control the gas expansion volume valve and the chamber valve to enter the closed state; b) control, after (a), the loadlock valve to enter an open state to allow a semiconductor wafer to be placed within the loadlock volume and to enter a closed state after the semiconductor wafer has been placed within the loadlock volume; c) control, after (b), the second mechanism to reduce gas pressure in the loadlock volume to a first low pressure; d) control, after (a), the first mechanism to reduce gas pressure in the gas expansion volume to a second low pressure lower than the first low pressure; e) control, after (c) and (d), the gas expansion volume valve to enter the open state, thereby allowing gas remaining in the gas expansion volume and the loadlock volume to mix and reach equilibrium at a third low pressure between the first low pressure and the second low pressure; and f) control, after (e), the chamber valve to enter the open state, thereby causing the loadlock volume and the chamber port to be fluidly connected with one another.

In some such implementations of the apparatus, the first low pressure may be lower than about 10E-6 Torr and the second low pressure may be between about 10 Torr and 1 milliTorr.

In some implementations of the apparatus, the second mechanism may be a roughing pump configured to evacuate gas from within the loadlock volume. The roughing pump may be fluidly isolated from the gas expansion volume and the chamber port when the gas expansion volume valve and the chamber valve are in the closed state. Furthermore, the first mechanism may be a turbopump configured to evacuate gas from within the gas expansion volume. The turbopump may be fluidly isolated from the loadlock volume and the chamber port when the gas expansion volume valve and the chamber valve are in the closed state.

In some implementations of the apparatus, the first mechanism may include a cryopump configured to condense gas within the gas expansion volume, and the cryopump may be fluidly isolated from the loadlock volume and the chamber port when the gas expansion volume valve and the chamber valve are in the closed state.

In some implementations of the apparatus the second mechanism may include a roughing pump configured to evacuate gas from within the loadlock volume and the roughing pump may be fluidly isolated from the gas expansion volume and the chamber port when the gas expansion volume valve and the chamber valve are in the closed state. In such implementations, the first mechanism may include a movable surface that partially defines the gas expansion volume and an actuator configured to move the movable surface. Movement of the movable surface may cause the gas expansion volume to increase or decrease in size, and the gas expansion volume may be at least one and a half times as large as the loadlock volume for at least one operating position of the actuator. In such implementations, the memory may further store computer-executable instructions for controlling the at least one processor to perform (d) by actuating the actuator and moving the movable surface to increase the size of the gas expansion volume to at least one and a half times the loadlock volume.

In some implementations, a method for operating an apparatus including an expansion volume, a chamber port, a loadlock volume, a gas expansion volume valve, a chamber valve, and a loadlock valve is provided. The gas expansion volume valve and the chamber valve may be configured such that the loadlock volume, the gas expansion volume, and the chamber port are fluidly connected with one another when the gas expansion volume valve and the chamber valve are in an open state, the loadlock volume, the gas expansion volume, and the chamber port are sealed off from one another when the gas expansion volume valve and the chamber valve are in a closed state, and the loadlock valve is interposed between the loadlock volume and an interface configured to receive a semiconductor wafer from an external source. The method may include a) controlling the gas expansion volume valve and the chamber valve to enter the closed state; b) controlling, after (a), the loadlock valve to enter an open state; c) placing, after (b), a semiconductor wafer into the loadlock via the loadlock valve; d) controlling, after (c), the loadlock valve to enter the closed state; e) decreasing, after (d), pressure within the loadlock volume to reach a first low pressure; f) decreasing, after (a), pressure within the gas expansion volume to reach a second low pressure lower than the first low pressure; g) controlling, after (e) and (f), the gas expansion volume valve to enter the open state, thereby allowing gas remaining in the gas expansion volume and the loadlock volume to mix and reach equilibrium at a third low pressure between the first low pressure and the second low pressure; h) controlling, after (g), the chamber valve to enter the open state, thereby causing the loadlock volume and the chamber port to be fluidly connected with one another; and i) moving, after (h), the semiconductor wafer out of the loadlock volume via the chamber port.

In some such implementations, the (e) may be performed by evacuating gas from within the loadlock volume using a roughing pump to reach the first low pressure and (f) may be performed by evacuating gas from within the gas expansion volume using a turbopump to reach the second low pressure.

In some further implementations, the method may further include j) condensing gas within the gas expansion volume using a cryopump at least during (f).

In some such implementations, the semiconductor wafer may at least be partially composed of epoxy.

In some implementations of the method, (e) may be performed by evacuating gas from within the loadlock volume using a roughing pump to reach the first low pressure and (f) may be performed by expanding the gas expansion volume to be at least one and a half times larger than the loadlock volume.

These and other aspects of this disclosure are explained more fully below with reference to the accompanying Figures.

BRIEF DESCRIPTION OF THE DRAWINGS

FIG. 6A depicts an isometric view of various portions of a semiconductor processing tool.

FIG. 6B depicts an isometric exploded view of the structures shown in FIG. 6A.

FIGS. 6A through 6G are to-scale within each Figure, although the Figures may not be to-scale with each other. The plots of FIGS. 7 through 9 have all be scaled along the X and Y axes by the same amount.

DETAILED DESCRIPTION

Figure 1:
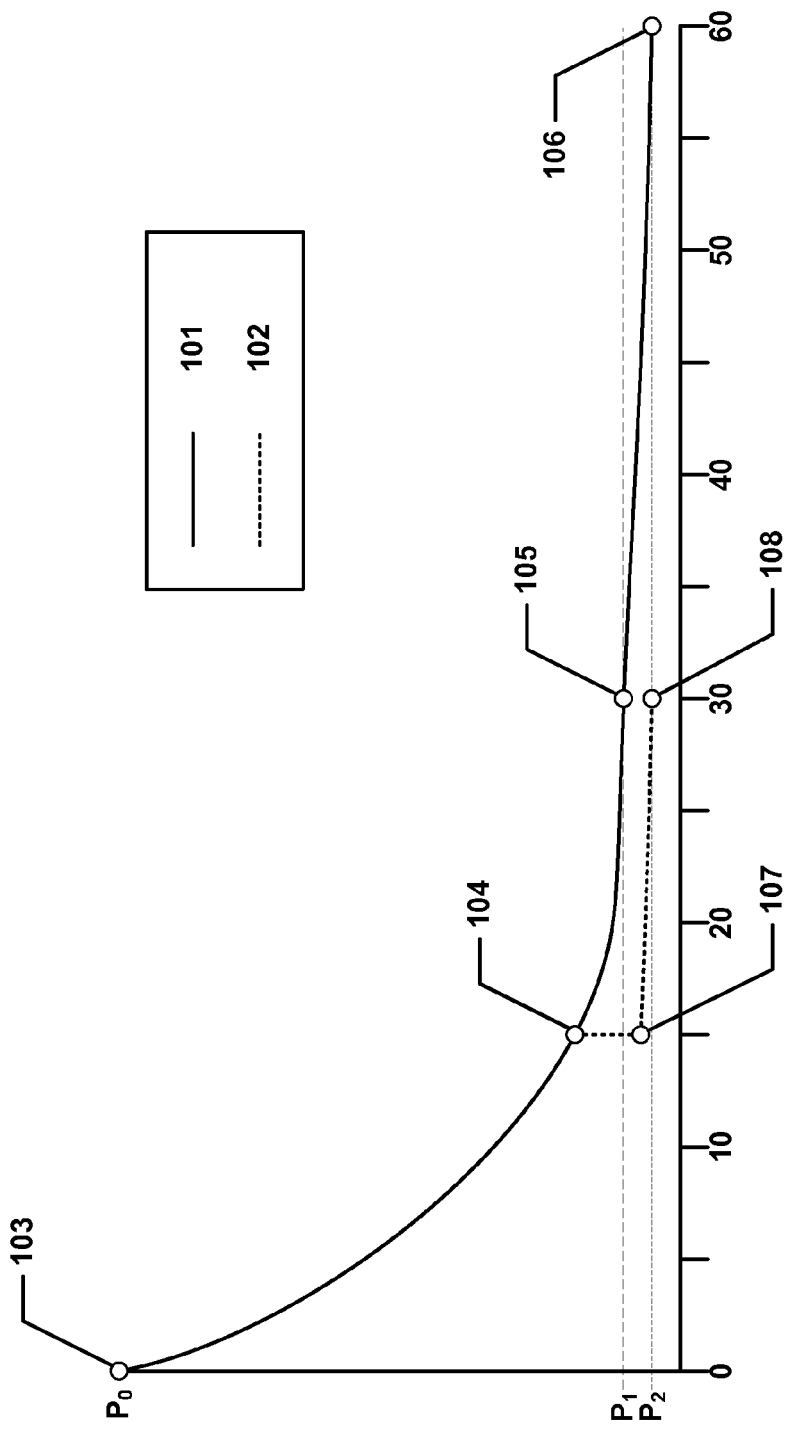
FIG. 1 illustrates hypothetical performance graphs for a standard loadlock and a gas expansion module-equipped loadlock.

The techniques and devices disclosed herein may be implemented in a variety of ways, including, but not limited to, the various implementations described below. It is to be understood that one of ordinary skill in the art may use the techniques and devices described herein to produce other implementations consistent with the information disclosed in this document, and that such alternative implementations are also to be considered as within the scope of this disclosure.

Semiconductor wafer processes typically require exacting environmental conditions within a semiconductor processing chamber. Gas composition, density, pressure, temperature, etc. may all be required to be within certain pre-established ranges in order to successfully process a semiconductor wafer. Providing these environmental conditions may require inducing various kinds of gas flow, e.g., evacuating gas from a portion of a semiconductor tool to produce a vacuum.

Gas flow, in general, can be categorized as falling within one of three categories: viscous flow, transitional flow, and molecular flow. Viscous flow generally refers to fluid flow under conditions where the mean free path of the molecules in the fluid flow is small in comparison with, for example, the smallest transverse section of a duct through which the fluid flows. In the case of fluid flow through a large chamber, viscous flow may be characterized by the mean free path of the molecules being small in comparison to the smallest overall internal dimension of the chamber. In viscous flow, for example, the density of gas molecules is generally high enough that many of the gas molecules collide with other gas molecules in the flow before colliding with, for example, the chamber walls. As a result, the mean free path of the gas molecules, i.e., the average distance that a gas molecule in the fluid flow travels before colliding with another molecule, is considerably shorter than the internal dimensions of the volume within which the flow occurs. In viscous flow, the flow of some portions of a substance may cause other, contiguous portions of the substance to exhibit similar flow characteristics.

Molecular flow generally refers to fluid flow under conditions where the mean free path of the molecules in the fluid flow is much greater than a characteristic system dimension, for example, the smallest transverse section of a duct through which the fluid flows. In the case of fluid flow through a large chamber, the mean free path may be much greater than, for example, the smallest overall internal dimension of the chamber. In molecular flow, the density of the gas molecules is sufficiently low that many of the gas molecules will collide with the chamber walls before colliding with another gas molecule. Due to the infrequency of molecule-molecule collisions in molecular flow, the flow of one gas molecule is unlikely to have much of an impact on other gas molecules in the flow. A flow's characterization as viscous or molecular at a given temperature is largely dependent on the density of the gas in the flow. For a given temperature, viscous flows occur at much higher pressures, e.g., 1 mTorr to 760 Torr, than molecular flows, e.g., 0.1 mTorr and below.

Transitional Flow refers to gas flows that exist between the viscous and molecular flow regimes.

Since semiconductor fabrication tools frequently process wafers at vacuum conditions but must also transfer wafers into and out of the tool, i.e., at near-ambient conditions, gas flows within a semiconductor tool may occur in all three regimes of fluid flow. Due to the physics involved, different types of vacuum pumps may be used during different flow regimes. Since most of the processing areas within a semiconductor tool may be held at relatively similar pressures, the majority of the multi-regime flow conditions may occur, for example, in the loadlocks of the tool. A loadlock is, in effect, an airlock used to load and unload wafers from the tool and therefore must transition between the relatively high-pressure conditions of the ambient environment to the low-pressure vacuum conditions of the tool environment.

Loadlocks typically include an inner gate valve (or other door-like mechanism configured to be switchable between an open state and a closed, hermetically-sealed state). It is to be understood that, as used herein, "hermetic" refers to an interface that is generally airtight under normal operating conditions. A hermetic seal may, nonetheless, permit an acceptable minimum amount of gas communication across the seal. For example, a high-vacuum gate valve may have a leak rate on the order of $10^{-8}$ to $10^{-9}$ Torr-liters/sec. Such leak rate amounts are typically defined and budgeted during equipment design, and are verified using methods described in, for example, standards such as SEMI E-16. It is to be understood that while the seals and valves used to maintain the pressure environments discussed herein may not provide a theoretically perfect seal due to such negligible leak rates, such seals and valves are still described as "preventing" fluid flow when closed.

The inner gate valve may be located in an inner port that is configured to be connected with a semiconductor processing chamber or, in various multi-chamber semiconductor processing tools, with a transfer module equipped to move a semiconductor wafer between the various chambers. The inner gate valve and associated inner port may be sized to allow the semiconductor wafer to be passed between the loadlock and an attached process or transfer chamber via the inner port and inner gate valve.

The loadlock may also include an outer gate valve (or other door-like mechanism configured to be switchable between an open state and a closed, hermetically-sealed state) similar to the inner gate valve. The outer gate valve may be located in an outer port that is configured to be connected with, for example, a wafer cassette that is configured to insert semiconductor wafers into the loadlock. In some implementations, the outer port may not be configured to connect with a wafer cassette, e.g., when wafers are provided using a robot arm without a hard-mount interface to the loadlock outer port. While the examples in this document typically refer to a wafer cassette, it is to be understood that similar apparatuses could be used with non-cassette-equipped loadlocks as well.

In addition to the inner and outer gate valves, loadlocks may also generally include a wafer support structure of some sort. In some loadlocks, such a wafer support may be provided using a pedestal, lift pins, or other relatively stationary (at least with respect to translation towards or away from the gate valves) support. Other loadlocks may include a robot arm or structure configured to not only support the semiconductor wafer but to also transfer the wafer through the inner gate valve, outer gate valve, or both gate valves.

Finally, loadlocks are typically connected with assorted pumps and fluidic lines configured to draw the loadlock down to an acceptable vacuum level from the typical pressure environment, e.g., process facility ambient conditions, present in the loadlock immediately after a semiconductor wafer is introduced to (or removed from) the loadlock via the outer gate valve.

For example, a roughing pump, such as a dry mechanical pump, may be used to draw down pressure in the loadlock by evacuating gas when the gas density is high enough to support viscous flow. The efficacy of roughing pumps drops off considerably as gas density decreases and the gas flow enters the transitional and molecular flow regimes. Rotary claw pumps, blower pumps, and/or booster pumps may be used, sometimes in combination, to provide roughing pump functionality.

As the pressure in the loadlock causes gas densities in the loadlock to approach those of the transitional flow regime, e.g., 1 mTorr, the roughing pump may be disengaged and a high-vacuum pump may be engaged to further draw down the pressure in the loadlock. In some loadlocks, a high-vacuum pump may not be used at all, and the loadlock may only be capable of reaching low pressures at the bottom end of the roughing pump's range (without further assistance from hardware external to the loadlock).

For example, a turbomolecular pump, or turbopump, may be used to evacuate molecular-flow regime gas that remains in the loadlock. Turbomolecular pumps may include a number of concentric, stacked rotating turbine blades interleaved with concentric, stationary turbine blades. As the turbine blades rotate, they impact gas molecules travelling into the throat of the turbomolecular pump and are forced through the turbine blade stack. A turbomolecular pump may be connected in series with a roughing pump downstream to assist in the evacuation of gas from the loadlock. In some implementations, the same roughing pump or pumps may be used as the roughing pump downstream from the turbomolecular pump and as the roughing pump used in the initial draw-down. In such implementations, the foreline of the roughing pump(s) may be configured to be switchable, for example, using valves, between being directly connected with the loadlock volume and being indirectly connected with the loadlock volume via the turbomolecular pump. The turbomolecular pump may be kept spinning even when not being used to draw a vacuum in the loadlock, and the valving system used may be able to isolate the turbomolecular pump from gas in the viscous flow regime while in this state to prevent damage to the turbomolecular pump.

Another example of a high-vacuum pump that may be used, either by itself or in combination with other high-vacuum pumps, is a cryopump. Cryopumps are devices that can be cooled to very low temperatures so as to trap gases and vapors through condensation. A cryopump, for example, may include a large surface that is cooled using, for example, helium or liquid nitrogen (or other suitable cooling mechanism). Any gas within, for example, a chamber that is in contact with the surface may condense on the surface and then freeze, thus reducing the amount of free gas within the chamber (thus reducing the gas pressure in the chamber). Cryopumps may be particularly useful for trapping water vapor, although cryopumps may also be used to trap other gases as well.

It is to be understood that a wide variety of different plumbing configurations may be used to facilitate gas evacuation and vacuum pump down from the loadlock and other components. Depending on cost and pump-down speed requirements, roughing pumps and vacuum pumps may be connected to such loadlocks and components in a variety of ways. The concepts described herein may generally be used with any of these various plumbing configurations.

Since the flow path of each gas molecule in the molecular flow regime is, statistically speaking, free from influence from other gas molecules, turbomolecular pumps rely, in a general sense, on gas molecules ricocheting off of the loadlock chamber walls until they happen to ricochet in a manner that leads them into the throat of the turbomolecular pump. Thus, turbomolecular pump performance benefits from the throat of the turbomolecular pump having relatively unobstructed line-of-sight to the interior of the portion of the tool being evacuated.

A variant of the above-described loadlock apparatus may include two or more loadlock chambers that may be stacked on top of one another within a single loadlock module. Each loadlock volume may be isolated from the other loadlock volumes from a fluidic communication view, i.e., each loadlock can be independently pressurized or drawn to a vacuum. Such a stacked, dual-chamber loadlock may, for example, be used to allow one semiconductor wafer to be transferred into the transfer chamber via the inner port and gate valve of one loadlock chamber while a second semiconductor wafer is transferred into or out of the other loadlock chamber via the outer port and gate valve. Such a system allows for the higher throughput of a tool utilizing two separate loadlock modules but does not require the floor footprint of two separate loadlock modules. Since each loadlock module generally occupies a separate mounting interface on a transfer module, a dual-module approach would occupy two transfer module mounting interfaces as compared with the single mounting interface occupied by a dual-loadlock module.

In some implementations of a loadlock, a gas expansion module may be integrated with, or attached to, the loadlock. The gas expansion module includes a gas expansion volume that may be fluidly connected with the loadlock volume via a valve or similar device that allows fluidic communication between the loadlock volume and the gas expansion module when the valve is open, and that prevents fluidic communication between the loadlock volume and the gas expansion module when the valve is closed. The gas expansion module may also be connected with a roughing pump and a high-vacuum pump such as a turbomolecular pump. In some implementations, a cryopump may be used as the high-vacuum pump, or as one of several high-vacuum pumps, that are connected with the system.

In principle, the gas expansion volume may be isolated from volumes within the loadlock, transfer chamber, and process chambers of a semiconductor processing tool by one or more valves, such as gate valves. When isolated, the gas expansion volume, which may typically be 1.5 to 10 times larger than the free volume within the loadlock, may be drawn down to a vacuum independent of the atmospheric conditions of the other volumes in the tool. Thus, the gas expansion volume may be drawn down to a very low pressure, e.g., in the $10^{-6}$ Torr to $10^{-3}$ Torr or the $10^{-7}$ Torr to $10^{-6}$ Torr range, by the roughing pump and/or high-vacuum pump connected with the gas expansion module while the loadlock volume is in fluidic communication with, for example, the much higher-pressure atmosphere of the wafer cassette, e.g., in the atmospheric range.

After the loadlock has been loaded with a wafer from the cassette or other higher-pressure environment, the loadlock volume may be barometrically isolated from the higher-pressure environment by closing the inner gate valve and/or the outer gate valve. The pressure in the loadlock volume may then be reduced using a roughing pump and/or high-vacuum pump. As the pressure in the loadlock volume drops off, the volumetric pumping efficiency of the pumps used may decrease significantly. For example, it might take 30 seconds for a loadlock to be pumped down to a pressure of $5\times10^{-5}$ Torr from 760 Torr, but might take an additional 30 seconds for the loadlock to be pumped down from $5\times10^{-5}$ Torr to $2.5\times10^{-5}$ Torr.

Loadlocks connected with a gas expansion module may allow for a significant reduction in the time needed to achieve a desired vacuum condition in the loadlock volume. The gas expansion volume may, for example, be fluidly connected with the loadlock volume during the load-lock volume pump-down process by opening the valve that isolates the gas expansion volume from the load-lock volume. When the gas expansion volume and the load-lock volume are fluidly connected, gas pressures within each volume will equalize. This will result in a relatively rapid pressure drop, i.e., at a much greater rate than the pumping system may supply, within the loadlock volume, and a corresponding relatively rapid pressure rise within the gas expansion volume. In implementations where the gas expansion volume is larger than the loadlock volume, the pressure drop in the loadlock volume will be greater than the pressure rise in the gas expansion volume. The above discussion assumes that the gas temperatures within the two volumes are equal prior to fluidly connecting them, although this is not necessary.

For example, if a loadlock with a loadlock volume V at pressure p is fluidly connected to a gas expansion volume of 3V at a pressure of 0.2p and at a similar temperature, the equalized pressure in both volumes will be approximately 0.4p, i.e., a relatively instantaneous 60% decrease in pressure.

FIG. 1 illustrates hypothetical performance graphs for a standard loadlock 101 and a gas expansion module-equipped loadlock 102. Considering first the case of the standard loadlock, at time t=0, the loadlock volume is at atmospheric pressure. Evacuation of the gases within the loadlock volume may begin at 103. A relatively rapid decrease in pressure may be experienced between 103 and 104. After 104, the reduced gas density results in less pump efficiency, and a much slower rate of pump-down occurs between 104 and 105. At 105, the loadlock pressure may, for example, be at pressure $P_1$. If further pressure reduction is required, for example, to $P_2$, the pump-down process may need to be performed for a greater duration, e.g., to 106. In this hypothetical, it takes as long to reduce the loadlock volume pressure from $P_1$ to $P_2$ (105 to 106) as it does to reduce the loadlock volume pressure from $P_0$ to $P_1$ (103 to 105).

The gas expansion module-equipped loadlock initially performs in a similar manner to a standard loadlock—this is because the gas expansion volume may initially be isolated from the loadlock volume. Accordingly, evacuation of the gases within the loadlock volume may begin at 103. A relatively rapid decrease in pressure may be experienced between 103 and 104. However, in contrast to the pump-down process for the standard loadlock, at 104, a valve is opened to establish a fluidic connection between the load-lock volume and the gas expansion volume. Between 104 and 107, the pressures within the two volumes equalize, dropping the loadlock volume pressure to less than $P_1$. Between 107 and 108, the loadlock volume is evacuated further to reduce the pressure to $P_2$ in roughly the same overall period of time that it took the standard loadlock to reach $P_1$ and approximately half the time that it took the standard loadlock to reach $P_2$.

While various loadlock/gas expansion module implementations may provide for different performance characteristics, an implementation with characteristics similar to those illustrated in FIG. 1 could be particularly well-suited in situations where process equipment is being upgraded but where it is desired to keep the process environmental parameters the same to avoid requalification and/or further development efforts. For example, if, in an effort to reduce overall semiconductor tool floor footprint, i.e., the floor space occupied by the tool, the transfer module is reduced in size to approximately 50% of its original free internal volume, it may be necessary, prior to establishing a fluidic connection between the transfer module and the loadlock, to reduce the pressure in the loadlock to approximately 50% of the pressure used with the original transfer module. This will ensure that the pressure environment within the transfer module after the transfer module and the loadlock equalize pressures with each other is substantially the same as it would have been using the original transfer module.

Figure 2:
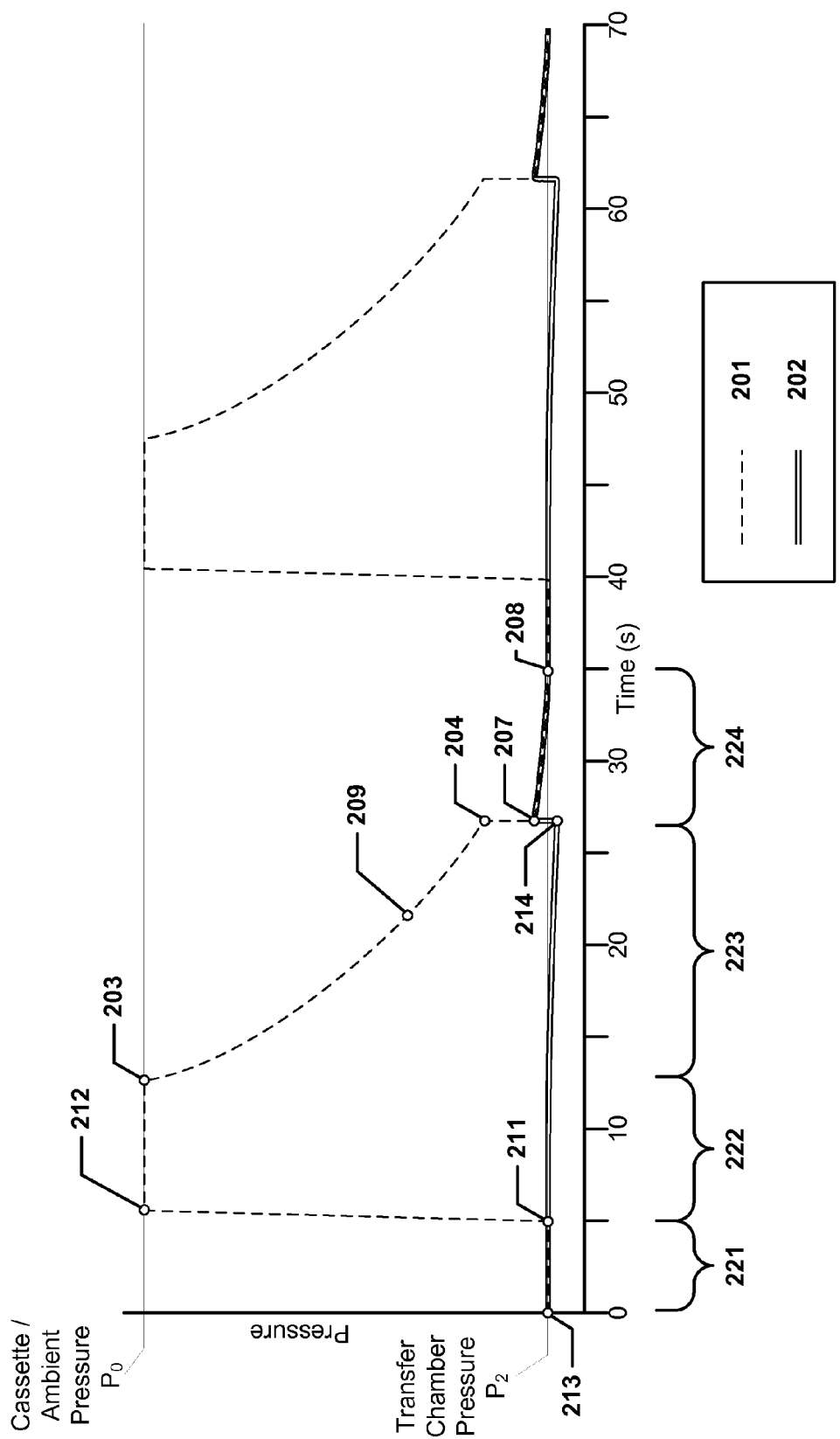
FIG. 2 illustrates hypothetical time-pressure curves for a loadlock volume and a gas expansion volume of the loadlock.
Figure 3:
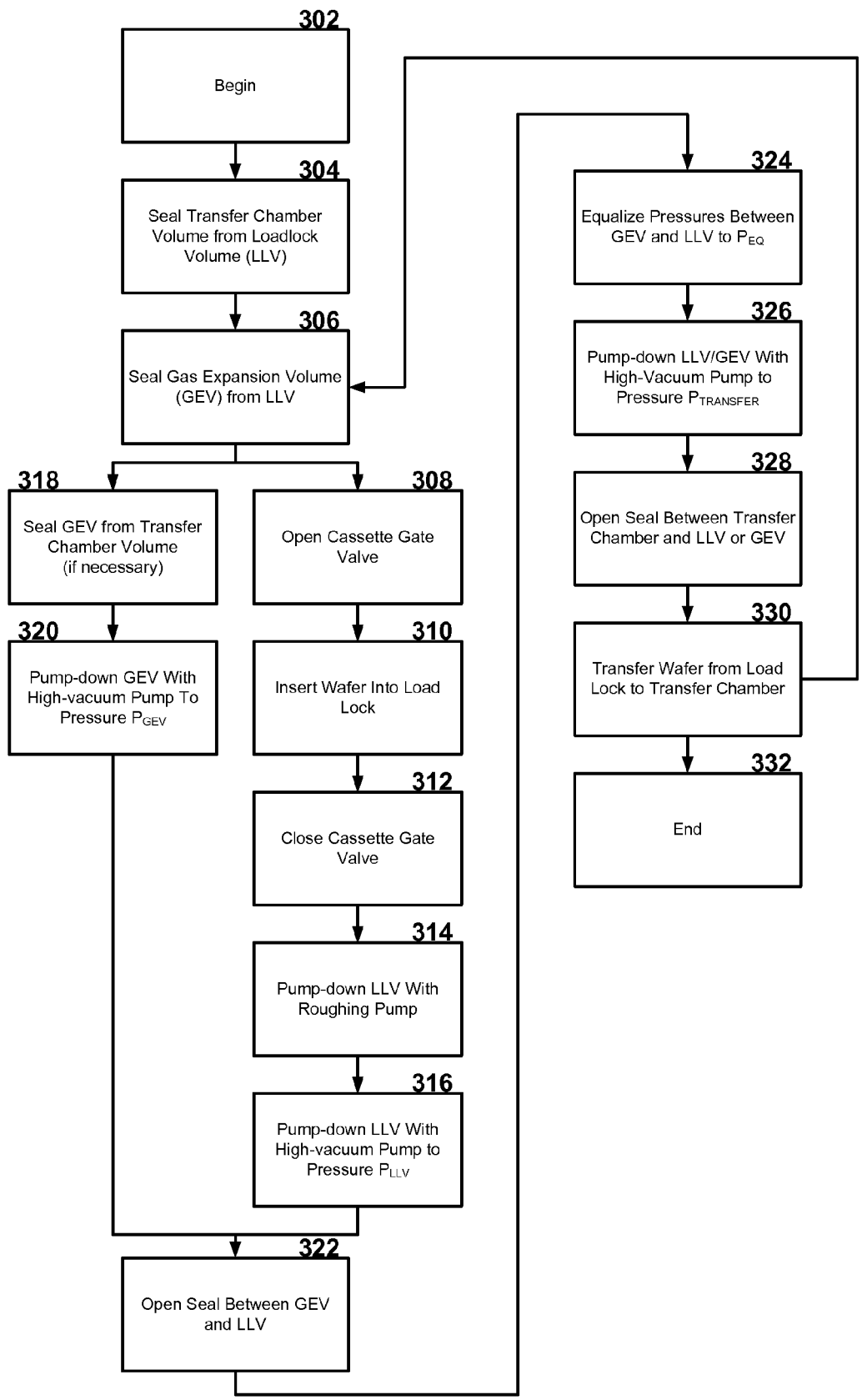
FIG. 3 depicts a flowchart of one technique of using a gas expansion module with a loadlock.

FIG. 2 illustrates hypothetical time-pressure curves for the loadlock volume and the gas expansion volumes of a loadlock equipped with a gas expansion module. Hypothetical time-pressure curve 201 is for the loadlock volume and hypothetical pressure-time curve 202 is for the gas expansion volume. Two operation cycles are shown, although only the first is discussed in detail (the second is simply a repetition of the first, although there is no requirement that the cycles be identical). Reference will also be made to flowchart 3, which begins at 302 and ends at 332, that may provide further understanding of a technique for using a gas expansion module with a loadlock.

In phase 221, which is bounded by 213 and 211, both the loadlock volume and the gas expansion volume are in fluidic communication with each other, and are at the transfer chamber pressure $P_2$. During phase 221, wafers may be transferred into/out of the loadlock volume from/to the transfer chamber volume. After the wafer transfer has completed and any wafer transfer mechanisms are clear of the volumes, the gas expansion volume and the loadlock volume may be sealed off (304) from the transfer chamber and from each other (306) at 211. During phases 222, bounded by 211 and 203, and 223, bounded 203 and 204, the pressure environments of the loadlock volume and the gas expansion volume may be isolated from each other and each may be separately regulated without affecting the other. For example, soon after, or even immediately after, the gas expansion volume is sealed off from the loadlock volume and the transfer chamber volume, pump-down of the gas expansion volume may be initiated (320) using a high-vacuum pump (and, if needed, a roughing pump prior to the high-vacuum pump). At the same time, the loadlock volume may be joined to a much higher-pressure environment $P_0$, such as ambient or near-ambient conditions in a wafer cassette or other environment, by opening, for example, a gate valve (308) to another portion of the tool at 211. While at this higher pressure, i.e., during phase 222, a wafer may be loaded into/withdrawn (310) from the loadlock from/into a component or area with the higher-pressure environment.

After the wafer handling operations at the higher pressure environment have completed, the loadlock volume may be sealed off (312) from the higher pressure environment at 203, and a roughing pump may be engaged to start pumping the loadlock volume down from $P_0$ (314) during phase 223, which is bounded by 203 and 204. At 209, the gas density in the loadlock volume may be low enough that the roughing pump efficiency is constrained. Thus, at 209, the roughing pump may be disengaged (e.g., sealed off using an associated valve) and a high-vacuum pump may be engaged (316). The pump-down of the gas expansion volume during phase 222 may, in the interim, continue unabated during phase 223.

At 204 and 214, the seal(s) between the loadlock volume and the gas expansion volume is removed (322), allowing the gases within each volume to combine and the pressures to equalize (324). Thus, the pressure in the loadlock volume drops from the level at 204 to the level at 207, and the pressure in the gas expansion volume rises from the level at 214 to the level at 207. During phase 224, which is bounded by 207 and 208, the joined loadlock and gas expansion volumes may be further pumped down using, for example, a high-vacuum pump (326) until a desired pressure is reached, e.g., the transfer chamber pressure $P_2$ at 208. When the desired pressure is reached, the gate valve sealing the transfer chamber from the loadlock may be opened (328) and the wafer transferred from the loadlock to the transfer chamber (330). In some implementations, the pressure in the transfer chamber may be a lower level than the target pressure of the loadlock/gas expansion module. At 208/330, the cycle may begin again, i.e., 208 and 213 may by synonymous with each other (304 may follow a previous instance of 330).

Depending on the physical parameters of the loadlock volume, the gas expansion volume, and various other parameters such as pump efficiency, the above process may be modified in a number of ways. For example, during phase 223, there may only be a roughing pump used to pump down the loadlock volume, and the high vacuum pump may only be engaged to pump down the loadlock volume while the loadlock volume is joined with the gas expansion volume during phase 224. In some implementations, there may be little or no need for high-vacuum pump down during phase 224. For example, the pressure in the gas expansion volume may be sufficiently low and the gas expansion volume sufficiently large that equalization of the gas expansion volume with the loadlock volume may result in an equalized pressure that is within an acceptable tolerance for $P_2$ without further pump-down. In other implementations, the gas expansion volume may not be pumped down to a pressure less than the target pressure $P_2$. In such implementations, the gas expansion volume will still be pumped down to a pressure less than the pressure in the loadlock volume, causing the combined loadlock/gas expansion volume to have a lower pressure after equalization than the loadlock volume had just prior to equalization.

Figure 4A:
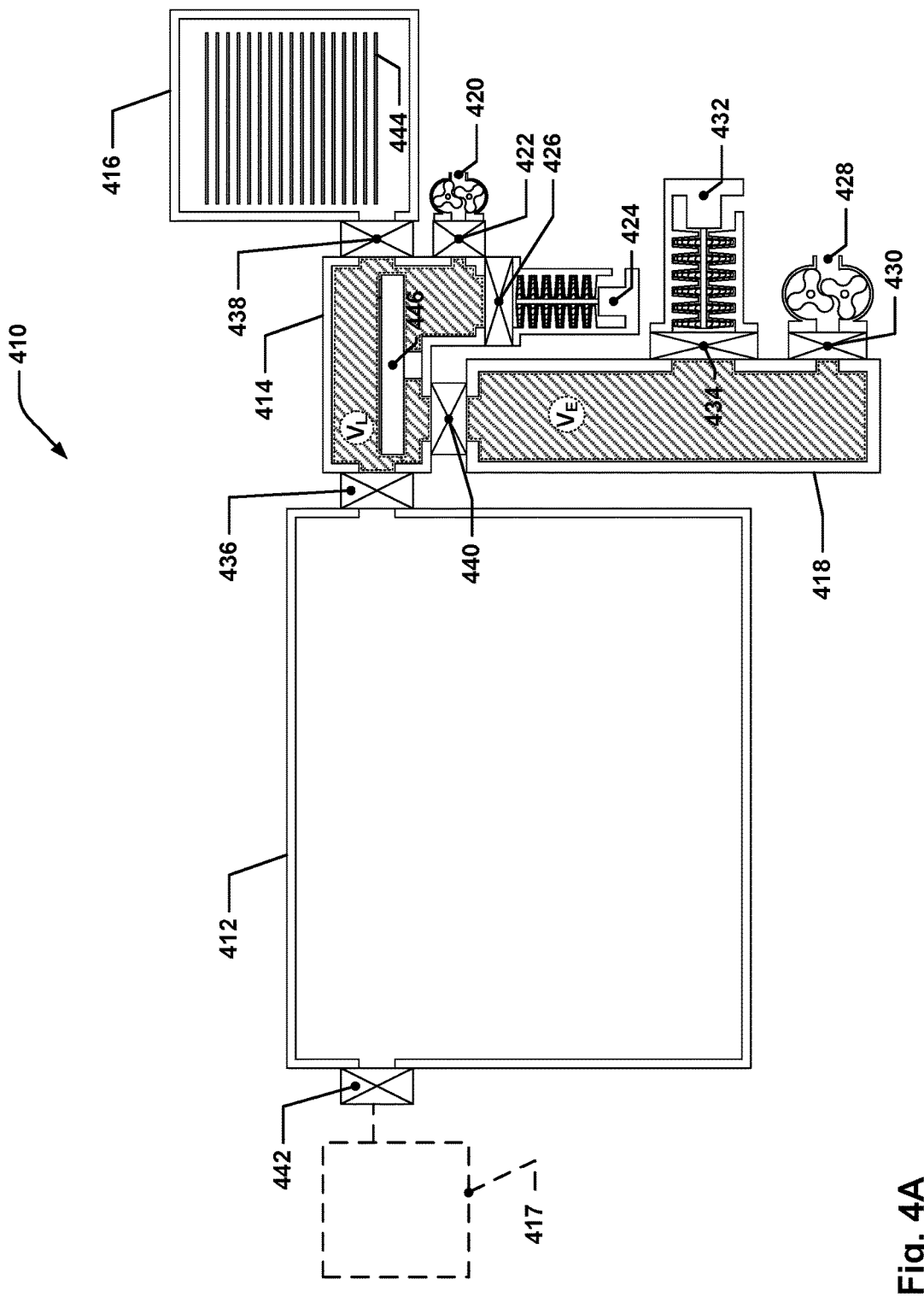
FIG. 4A depicts a high-level, conceptual diagram of one implementation of a gas expansion module in a semiconductor tool.

FIG. 4A depicts a conceptual schematic of a tool 410 with a gas expansion module-equipped loadlock. A loadlock 414 may be connected with several volumes, including transfer chamber 412, gas expansion module 418, and wafer cassette 416. The transfer chamber 412 may include one or more transfer chamber valves 442 that may be used to seal off process chambers 417 (also shown in FIGS. 4B and 4C) attached to the transfer chamber. The transfer chamber 412 may also include one or more loadlock/transfer chamber valves 436 to allow the loadlock 414 to be sealed off from the transfer chamber 412. The loadlock 414 may include one or more wafer supports 446 that may be used to support one or more wafers 444. The wafers 444 may be loaded into the loadlock 414 from the wafer cassette 416. A loadlock/cassette valve 438 may be used to seal the wafer cassette 416 off from the loadlock 414. A roughing pump 420 may be fluidly connected to the loadlock 414 via a loadlock roughing pump valve 422. Similarly, a high-vacuum pump 424 may be fluidly connected to the loadlock 414 by a loadlock high-vacuum valve 426.

The gas expansion module 418 may be coupled to the loadlock 414 by a loadlock/gas expansion module valve 440. The gas expansion module 418 may also be connected to a high-vacuum pump 432 via a gas expansion module high-vacuum pump valve 434, as well as to a roughing pump 428 via a gas expansion module roughing pump valve 430. Volume $V_L$ may define the loadlock internal free volume, e.g., loadlock volume, and volume $V_E$ may define the gas expansion module internal free volume, e.g., gas expansion volume.

Figure 4B:
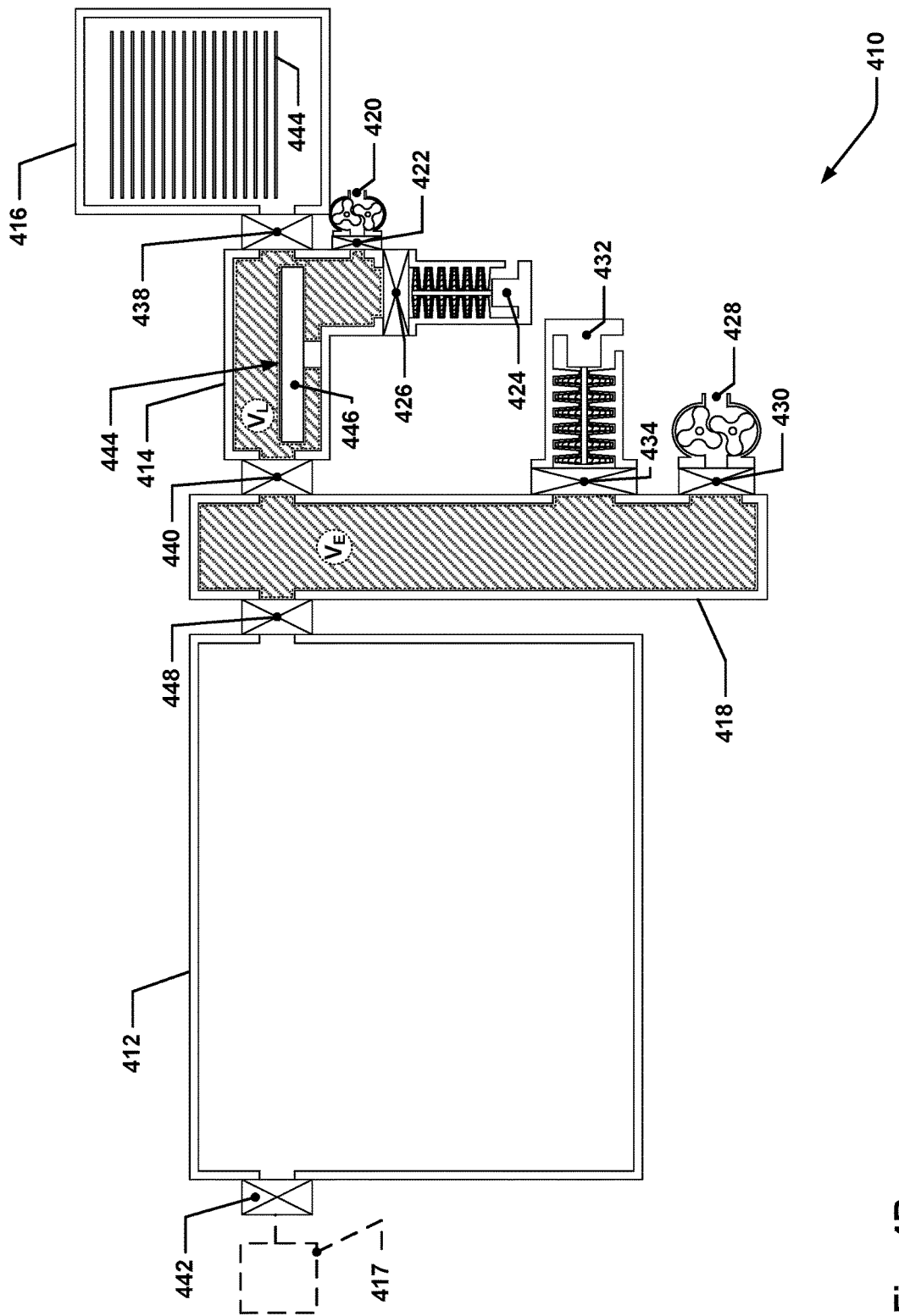
FIG. 4B depicts a high-level, conceptual diagram of another implementation of a gas expansion module in a semiconductor tool.

FIG. 4B depicts a conceptual schematic of an alternate tool 410 with a gas expansion module-equipped loadlock. In this implementation, the gas expansion module 418 is interposed between the loadlock 414 and the transfer chamber 412. The gas expansion module is connected to the transfer chamber by a transfer chamber/gas expansion module valve 448, the loadlock 414 no longer includes the loadlock/transfer chamber valve(s) 436 since it has been supplanted by the transfer chamber/gas expansion module valve 448, and the loadlock/gas expansion module valve 440 may be positioned to allow for wafers to be passed through the gas expansion module 418 and into or out of the loadlock 414. The remaining aspects of such an implementation may, however, be largely similar to those shown in FIG. 4A.

Figure 4C:
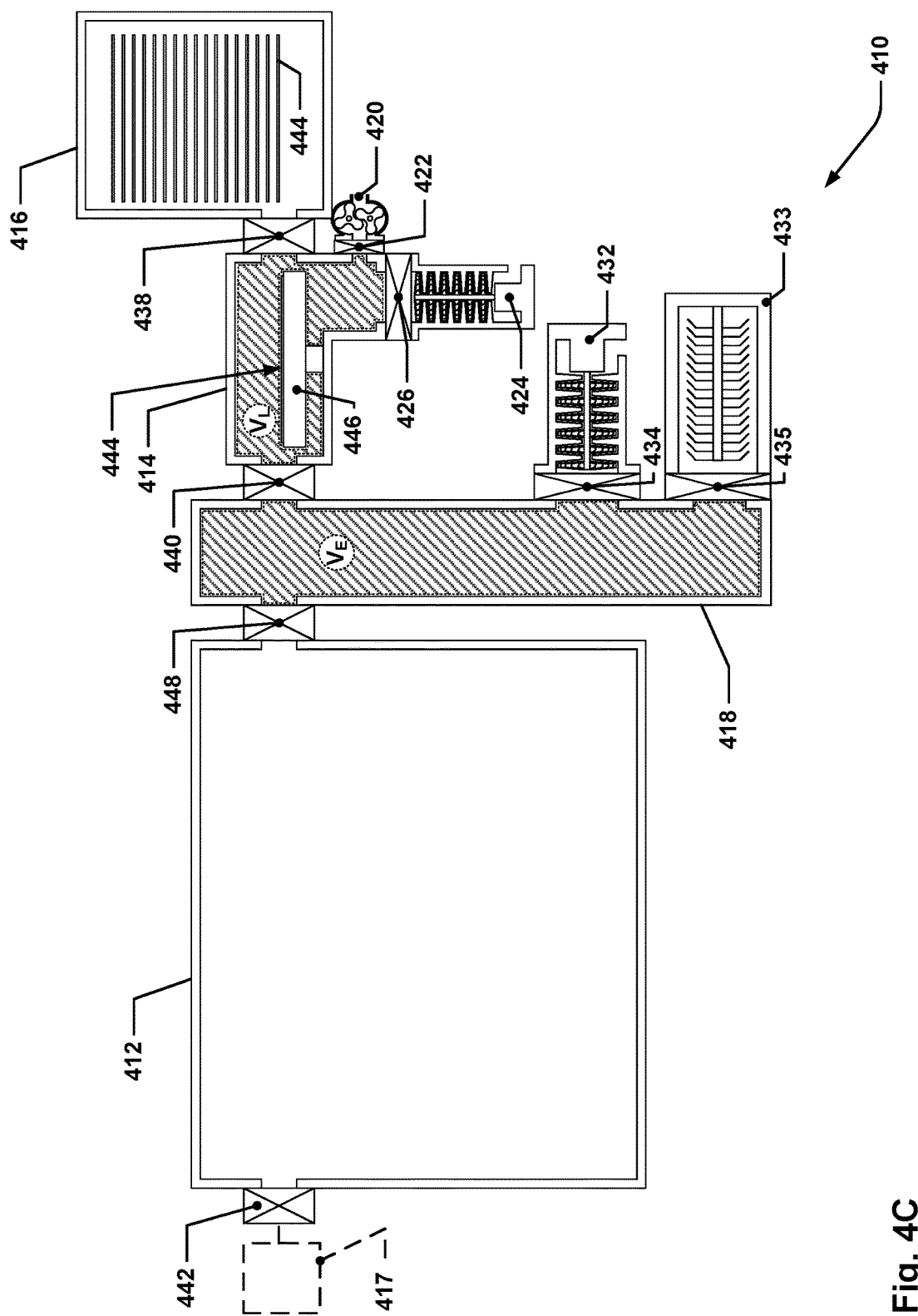
FIG. 4C depicts a conceptual schematic of another alternate tool 410 with a gas expansion module-equipped loadlock.

FIG. 4C depicts a conceptual schematic of another alternate tool 410 with a gas expansion module-equipped loadlock. In this implementation, as with the implementation shown in FIG. 4B, the gas expansion module 418 is interposed between the loadlock 414 and the transfer chamber 412. One difference between the implementation of FIG. 4B and the implementation of FIG. 4C is that the implementation of FIG. 4C has a gas expansion module 418 that is equipped with a cryopump 433 that is connected to the gas expansion module 418 via a cryopump valve 435. The cryopump valve 435 may be used to seal off the cryopump 433 from the gas expansion module 418 to allow the cryopump to be purged of accumulated condensate without reintroducing the condensate into the gas expansion module 418. In some implementations, the cryopump valve 435 may be omitted and the cryopump 433 may be directly connected with the gas expansion module 418. In some implementations, the condensing structures of the cryopump 433 may actually be located within the interior volume of the gas expansion module 418, i.e., not be a separate, bolt-on component. The remaining aspects of such implementations may, however, be largely similar to those shown in FIG. 4B.

Figure 10A:
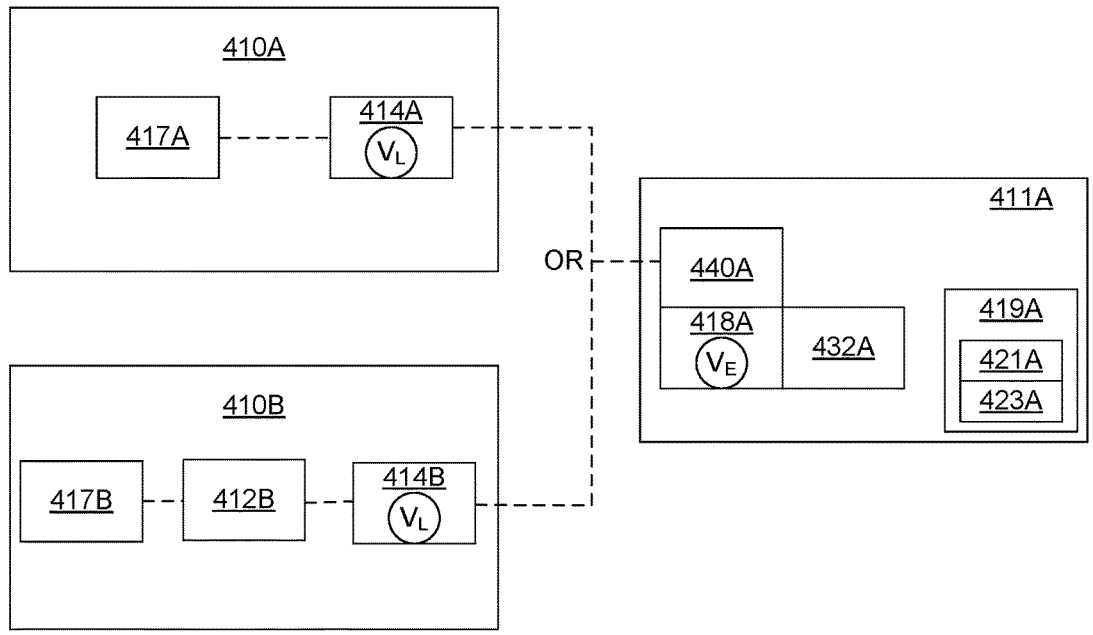
FIG. 10A depicts a conceptual block diagram of an example apparatus with two example semiconductor tools.

FIG. 10A depicts a conceptual block diagram of an example apparatus with two example semiconductor tools. FIG. 10A includes an apparatus 411A that includes a housing 418A that defines the gas expansion volume $V_E$, the gas expansion volume valve 440A (i.e., the gas expansion module valve described above), a first mechanism 432A which may be a high-vacuum pump described above, and a system controller 419A that includes one or more memory devices 421A and one or more processors 423A described below. These features are the same as those described above in FIGS. 4A-4C. For instance, the first mechanism 432A is fluidically connected with the gas expansion volume $V_E$, the first mechanism 432A is configured to control gas pressure within the housing 418A and to cause the pressure in the housing 418A to be reducible to lower than 10E-3 Torr, and the first mechanism 432A is fluidically isolated from the loadlock volume $V_L$ when the gas expansion volume valve 440A is in the closed state and when the apparatus 411A is connected with the loadlock 414A. FIG. 10A also includes a first example semiconductor tool 410A that includes one or more process chambers 417A that is fluidically connected to the loadlock 414A that has a loadlock volume $V_L$. The second example semiconductor tool 410B of FIG. 10A includes one or more process chambers 417B fluidically connected to a transfer chamber 412B and the loadlock 414B with the loadlock volume $V_L$; the transfer chamber is interposed between the loadlock 414B and the one or more process chambers 417B like depicted in FIG. 4A, for instance. The first and second example tools 410A and 410B may include the same features as those described above in FIGS. 4A-4C. In some embodiments, the apparatus 411A is configured to be installed on the either first example semiconductor tool 410A or the second example semiconductor tool 410B.

Figure 10B:
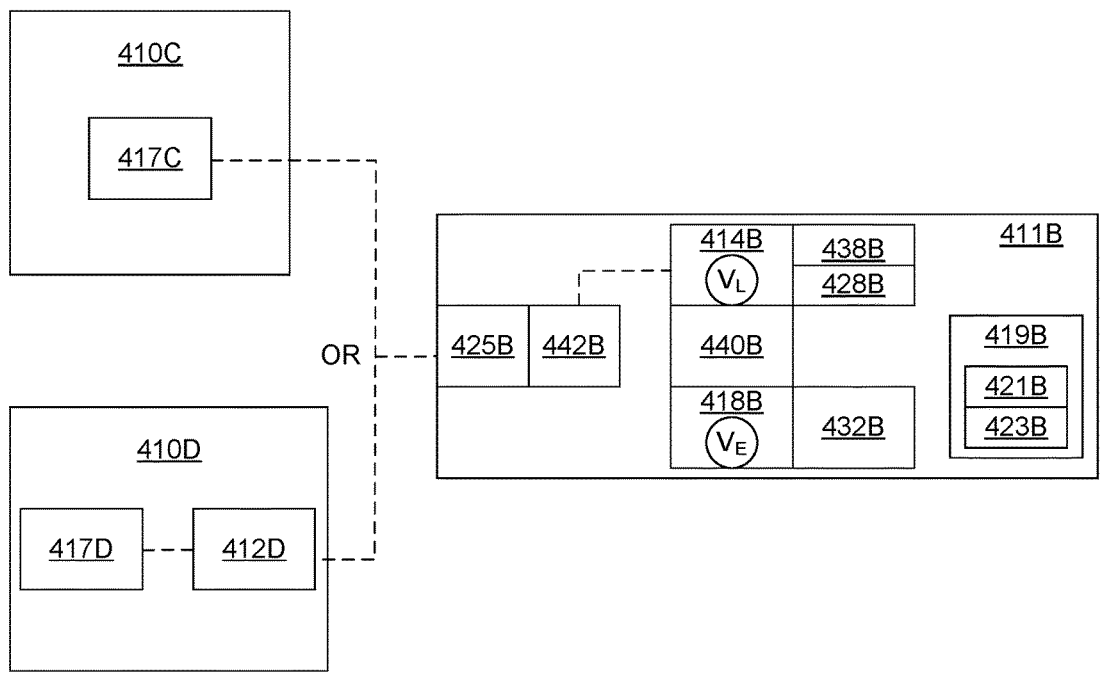
FIG. 10B depicts a conceptual block diagram of another example apparatus with two example semiconductor tools.

Additionally, in some embodiments, like depicted in FIG. 10A for example, the housing 418A is configured to connect with the loadlock 414A or 414B such that the gas expansion volume valve 440A is interposed between the loadlock volume $V_L$ and the gas expansion volume $V_E$ when so connected, the gas expansion volume $V_E$ is configured to be separate from the one or more process chambers 417A and 417B and separate from any transfer chamber 412B of the semiconductor processing tool 410A or 410B, the gas expansion volume valve 440A is configured to be movable between an open state and a closed state, the gas expansion volume valve 440A permits fluidic communication between the loadlock volume $V_L$ and the gas expansion volume $V_E$ when in the open state and when the apparatus 411A is connected with the loadlock 414A or 414B, and the gas expansion volume valve 440A prevents fluidic communication between the loadlock volume $V_L$ and the gas expansion volume $V_E$ when in the closed state and when the apparatus 411A is connected with the loadlock 414A or 414B;

FIG. 10B depicts a conceptual block diagram of another example apparatus with two example semiconductor tools. FIG. 10B includes an apparatus 411 that includes one or more housings 418B that defines the gas expansion volume $V_E$ and the loadlock 414B with the loadlock volume $V_L$, a loadlock valve 438B, the gas expansion volume valve 440B, a first mechanism 432B which may be a high-vacuum pump described above, a second mechanism 428B which may be a roughing pump described above, a system controller 419A that includes one or more memory devices 421A and one or more processors 423A described below, a chamber port 425B, and a chamber valve 442B. FIG. 10B also includes two other example semiconductor tools, tool 410C having one or more processing chambers 417C and tool 417D having one or more processing chamber 417D and a transfer chamber 412D. All of these items may be the same as those described above in FIGS. 4A-4C. For instance, the chamber port 425B may be configured to be fluidically connected to the one or more processing chambers 417C of tool 410C or the transfer chamber 412D of tool 410D, the gas expansion volume valve 440B may be interposed between the loadlock volume $V_L$ and the gas expansion volume $V_E$, the chamber valve 442B may be configured to seal the chamber port 425B off from the loadlock volume $V_L$ and the gas expansion volume $V_E$ when the chamber valve 442B is closed and the gas expansion volume valve 440B is open, the first mechanism 432B may be configured to evacuate gas from the gas expansion volume $V_E$ regardless of whether the gas expansion volume valve 440B is in the open state or the closed state, the a loadlock valve 438B may be connected to the loadlock volume $V_L$, and the second mechanism may be configured to control pressure in the loadlock volume $V_L$.

Additionally, in some embodiments, like depicted in FIG. 10B for example, the gas expansion volume valve 440B and the chamber valve 442B are configured such that the loadlock volume $V_L$, the gas expansion volume $V_E$, and the chamber port 425B are fluidically connected with one another when the gas expansion volume valve 440B and the chamber valve 442B are in an open state and the loadlock volume $V_L$, the gas expansion volume $V_E$, and the chamber port 425B are sealed off from one another when the gas expansion volume valve 440B and the chamber valve 442B are in a closed state. The gas expansion volume $V_E$ may also be configured to be separate from the one or more processing chamber 417C and 417D, and the transfer chamber 412D, the first mechanism 432B is fluidically connected with the gas expansion volume $V_E$, the first mechanism is configured to control gas pressure within the gas expansion volume $V_E$ of the one or more housings 418B and to cause the pressure in the gas expansion volume $V_E$ of the one or more housings 418B to be reducible to lower than 10E-3 Torr, and the first mechanism 432B is fluidically isolated from the loadlock volume $V_L$ when the gas expansion volume valve 440B is in the closed state and when the gas expansion volume $V_E$ of the one or more housings 418B is connected with the loadlock $V_L$.

The configurations shown in FIGS. 4A through 4C are simply examples of three basic implementations of a gas expansion module-equipped system. Various particulars of such systems may be modified as requirements dictate or allow. For example, one or more pumps may be omitted if not required for a particular implementation, e.g., the loadlock high-vacuum pump may not be required if the gas expansion module 418 and the loadlock 414 are fluidly joined prior to the point where the loadlock pressure is in the transitional flow regime. In another example, the functionality provided by two separate pumps may instead be provided by a single pump and additional valving that routes the pump functionality as needed. It should also be understood that other components, not shown, may be used as well. For example, a roughing pump may be required downstream of the high-vacuum pumps in order to properly operate the high-vacuum pumps.

Figure 5A:
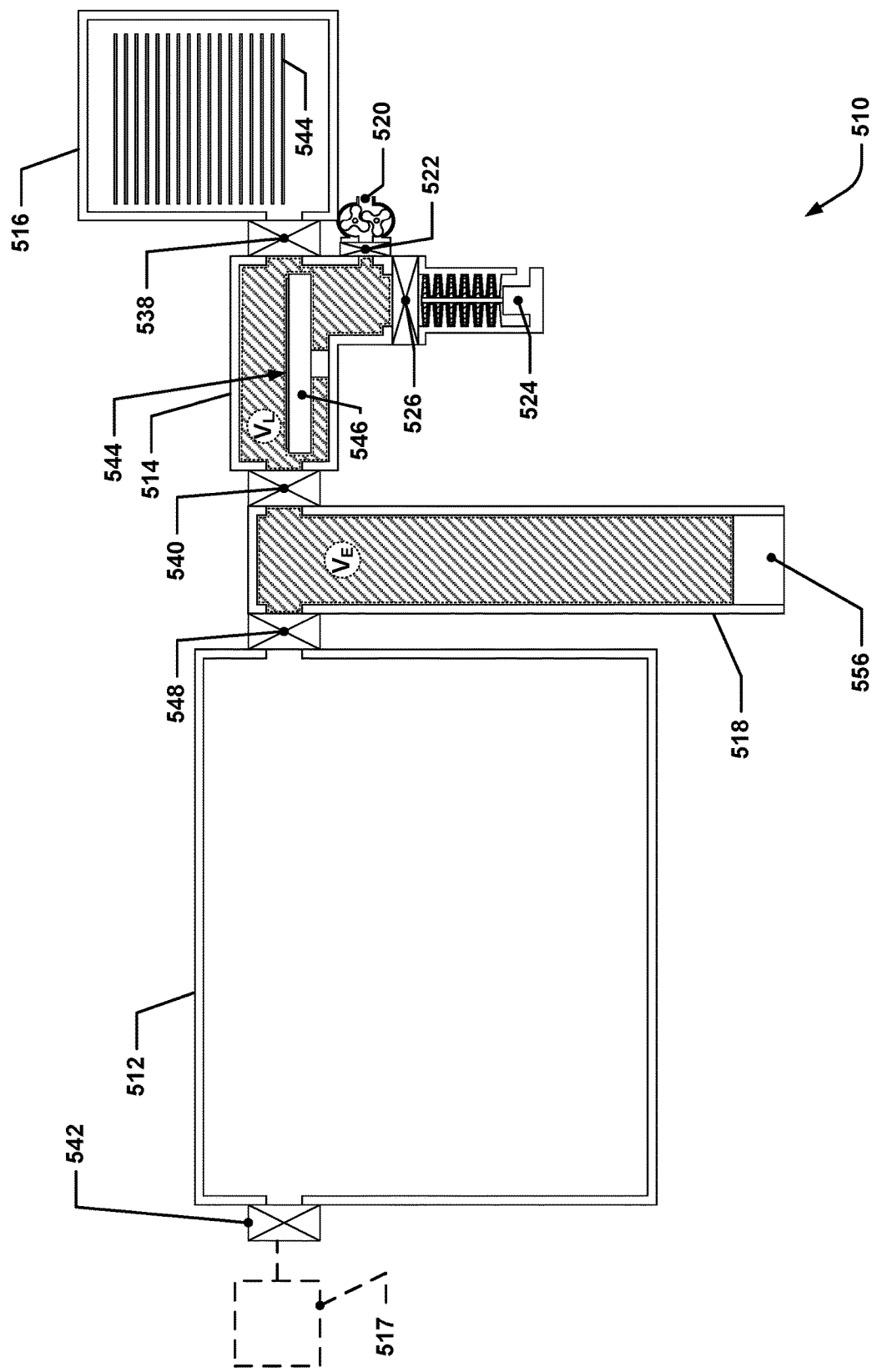
FIG. 5A depicts a high-level, conceptual diagram of an implementation of a gas expansion module with a variable internal volume in a semiconductor tool.
Figure 5B:
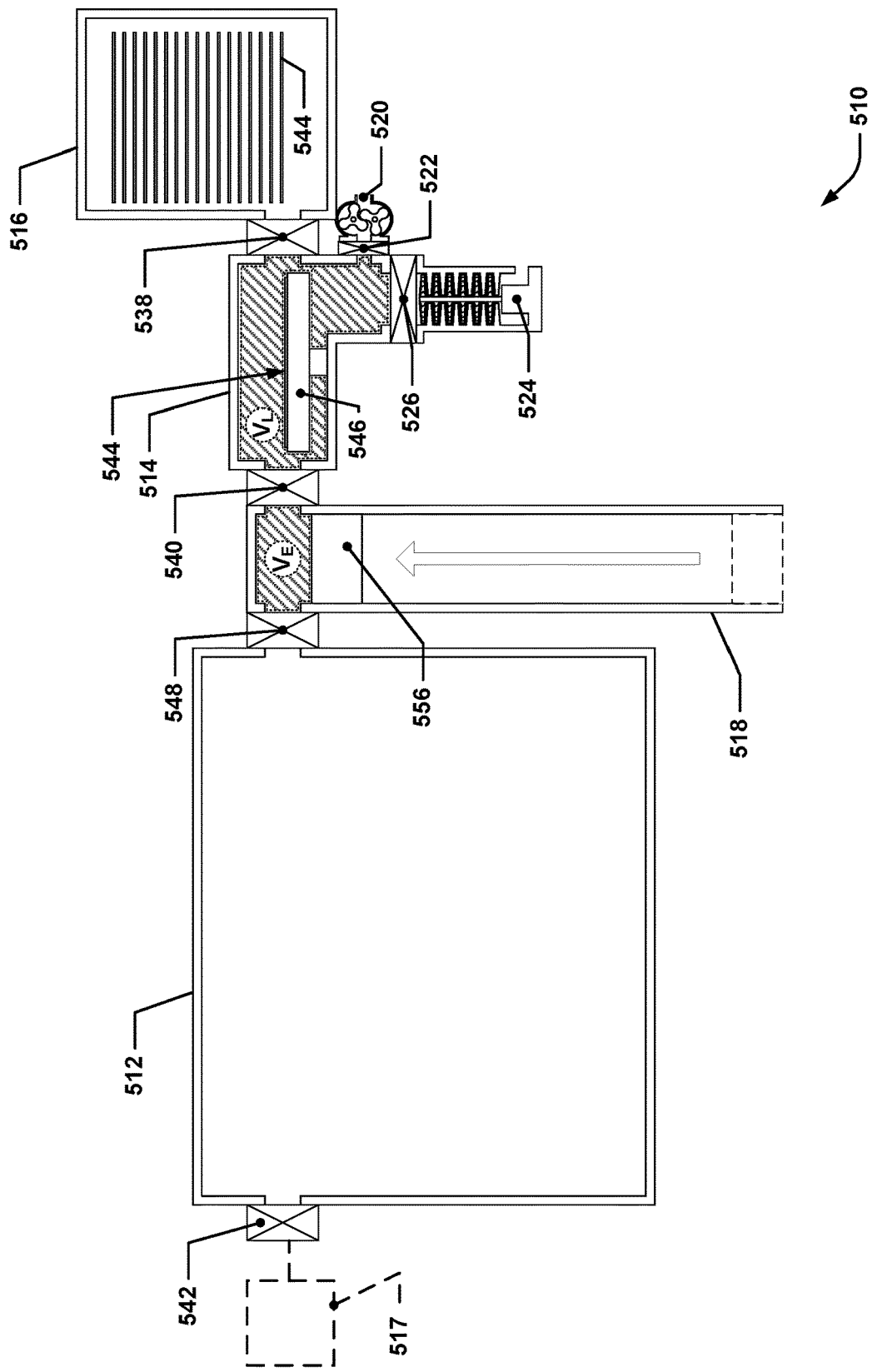
FIG. 5B depicts a high-level, conceptual diagram of the implementation of FIG. 5A with the variable internal volume at a minimum or near-minimum level.

FIG. 5A depicts a conceptual schematic of a tool 510 with a gas expansion module-equipped loadlock. A loadlock 514 may be connected with a gas expansion module 518 and a wafer cassette 516. The gas expansion module 518 may, in turn, be connected with a transfer chamber 512 via a transfer chamber/gas expansion module valve 548(s). The transfer chamber 512 may include one or more transfer chamber valves 542 that may be used to seal off process chambers 517 (also shown in FIG. 5B) attached to the transfer chamber. The transfer chamber/gas expansion module valve(s) 548 may allow the gas expansion module 518 to be sealed off from the transfer chamber 512. The loadlock 514 may include one or more wafer supports 546 that may be used to support one or more wafers 544. The wafers 544 may be loaded into the loadlock 514 from the wafer cassette 516. A loadlock/cassette valve 538 may be used to seal the wafer cassette 516 off from the loadlock 514. A roughing pump 520 may be fluidly connected to the loadlock 514 via a loadlock roughing pump valve 522. Similarly, a high-vacuum pump 524 may be fluidly connected to the loadlock 514 by a loadlock high-vacuum valve 526.

The gas expansion module 518 may be coupled to the loadlock 514 by a loadlock/gas expansion module valve 540. In contrast to the implementations shown in FIGS. 4A and 4B, i.e., gas expansion modules with fixed internal volumes, gas expansion module 518 may be configured to have a mechanically variable volume. For example, a large portion of the internal volume of the gas expansion module 518 may be defined by a constant cross-section that may act as a piston bore. A piston or plunger 556, i.e., an element that may be moved relative to the gas expansion module housing, may be movable along the bore axis. A sliding seal or seals between the piston/plunger 556 and the bore wall may be used to provide a vacuum-tight seal. The piston/plunger 556 may be moved between two (or more) positions such that whatever gas is trapped in the gas expansion module 518 internal volume expands or contracts, i.e., decreases or increases pressure, with the change in the gas expansion module 518's internal volume.

Volume $V_L$ may define the loadlock internal free volume, and volume $V_E$ may define the gas expansion module internal free volume, e.g., gas expansion volume. $V_E$ may be variable due to the use of a mechanical piston or plunger that defines one boundary of the gas expansion volume. For example, in the extreme case, $V_E$ could be nearly 0 (some residual gas would likely be trapped in various ports or valve areas recessed from the bore) when the piston/plunger 556 is bottomed out in the piston bore. When the piston/plunger 556 is then displaced to the opposite end of the gas expansion module 518, $V_E$ would increase accordingly and the pressure in the gas expansion module 518 would drop. When the loadlock/gas expansion module valve 540 is opened, the gases contained in the gas expansion module 518 and the loadlock 514 are allowed to commingle and reach equilibrium, much as in the implementations discussed above with reference to FIGS. 4A and 4B. It should be noted that the loadlock/gas expansion module valve 540 may not be needed in such implementations, as the primary purpose for such a valve is to allow for the isolation of a gas expansion module from a loadlock. This allows the gas expansion module to be pumped down to a lower pressure while ambient-atmosphere processes/tasks are performed in the loadlock. Without such a valve, the gas expansion module would serve little purpose since it would simply always be part of the loadlock volume and would actually decrease pump-down efficiency. However, a variable-volume gas expansion module offers a relatively quick "pump-down" rate—the pressure decrease would essentially be directly related to the speed at which the plunger/piston 556 is withdrawn. Thus, the added complexity of the loadlock/gas expansion module valve 540 may be unnecessary in such implementations.

It should also be noted that a series or cluster of pistons could be used in such implementations, as well as other variable-volume systems, e.g., bellows. It should also be noted that the variable-volume approach of FIGS. 5A and 5B may be combined with the externally-pumped approaches of FIG. 4A or 4B. For example, a high-vacuum pump and/or roughing pump may be mounted to the bottom of the cylinder bore for a variable-volume gas expansion module. After the internal volume has been increased to maximum and the gas contained within has decrease in pressure, the pumps may be engaged as appropriate to further evacuate any gases contained within. The piston or other volumetric-change device may be driven by appropriate technologies, e.g., hydraulics, linear actuators, ball screw drives, etc.

In some implementations, a variable gas expansion module may be fluidly connected to the internal volume of the loadlock via a filtered port to reduce the possibility of particulate contamination from wear on the sliding seals.

FIG. 6A depicts an isometric view of a portion of a semiconductor processing tool 610. The depicted portion includes a dual-wafer loadlock 614, a gas expansion module 618, and a transfer chamber 612. Some components/subcomponents of these systems may be omitted for clarity, such as the loadlock/cassette valve. While a dual-wafer loadlock is shown, a single-wafer loadlock could be used as well. As can be seen, the gas expansion module 618 in this case is larger in size compared to the loadlock 614. FIG. 6B shows the same components as shown in FIG. 6A, but as an exploded view.

Figure 6C:
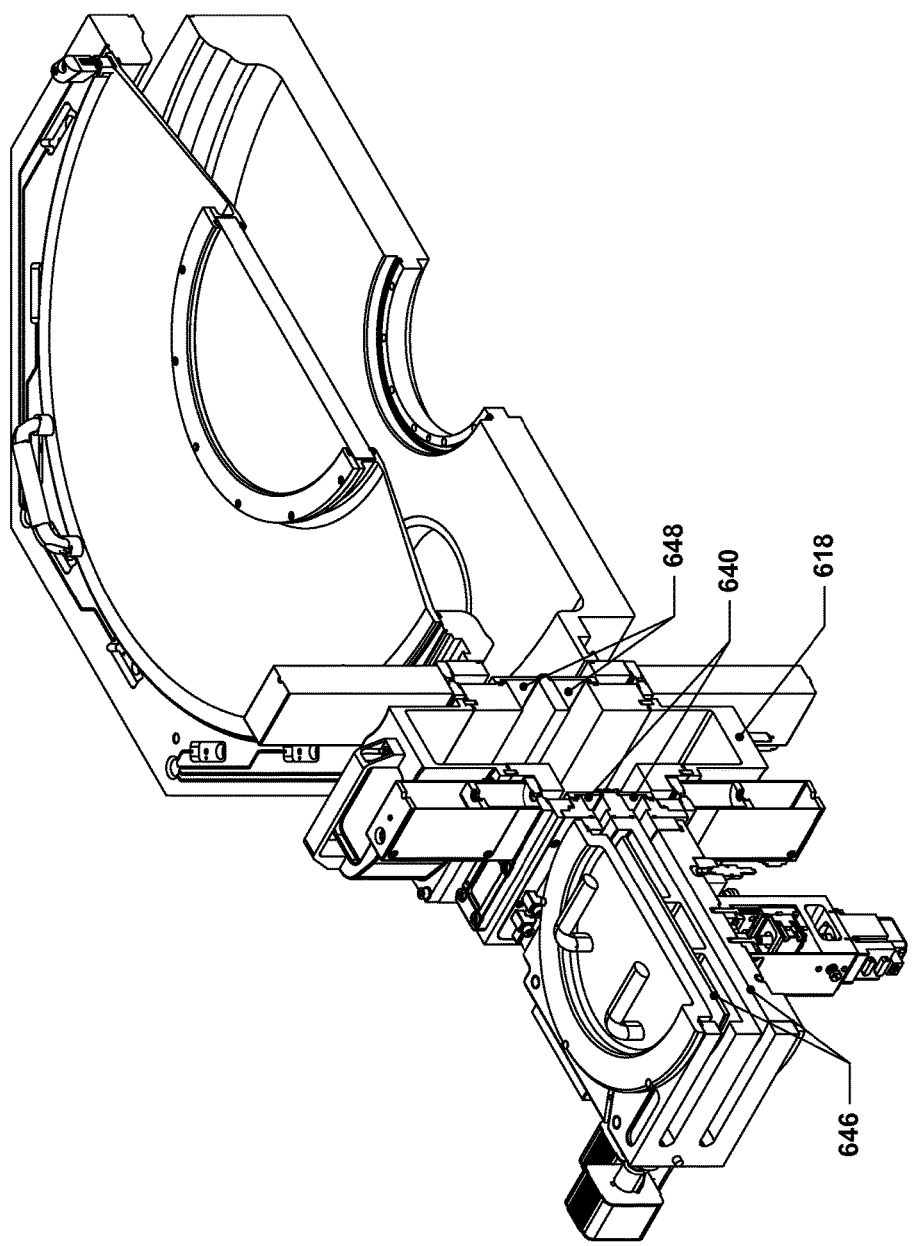
FIG. 6C depicts an isometric cutaway of the structures shown in FIG. 6A.

FIG. 6C shows a cutaway isometric view of the semiconductor processing tool 610. Structures introduced in previous figures may not be separately called out in FIG. 6C, but the reader is invited to reference the earlier figures for the relevant callouts if needed. Two wafer supports 646 may be seen inside of the loadlock 614, although a single wafer support may be used instead if appropriate. As can be seen, the free internal volume of the loadlock 614 is significantly smaller in size than the free internal volume visible of the gas expansion module 618. Also visible are two gate valves that serve as loadlock/gas expansion module valves 640, as well as two gate valves that serve as transfer chamber/gas expansion module valves 648. Both sets of valves are closed, corresponding with, for example, the configuration used in phases 222 and 223 in FIG. 2. In some implementations, the valves may be opened in parallel. In other implementations, the valves for each loadlock wafer volume may be opened independently.

Figure 6D:
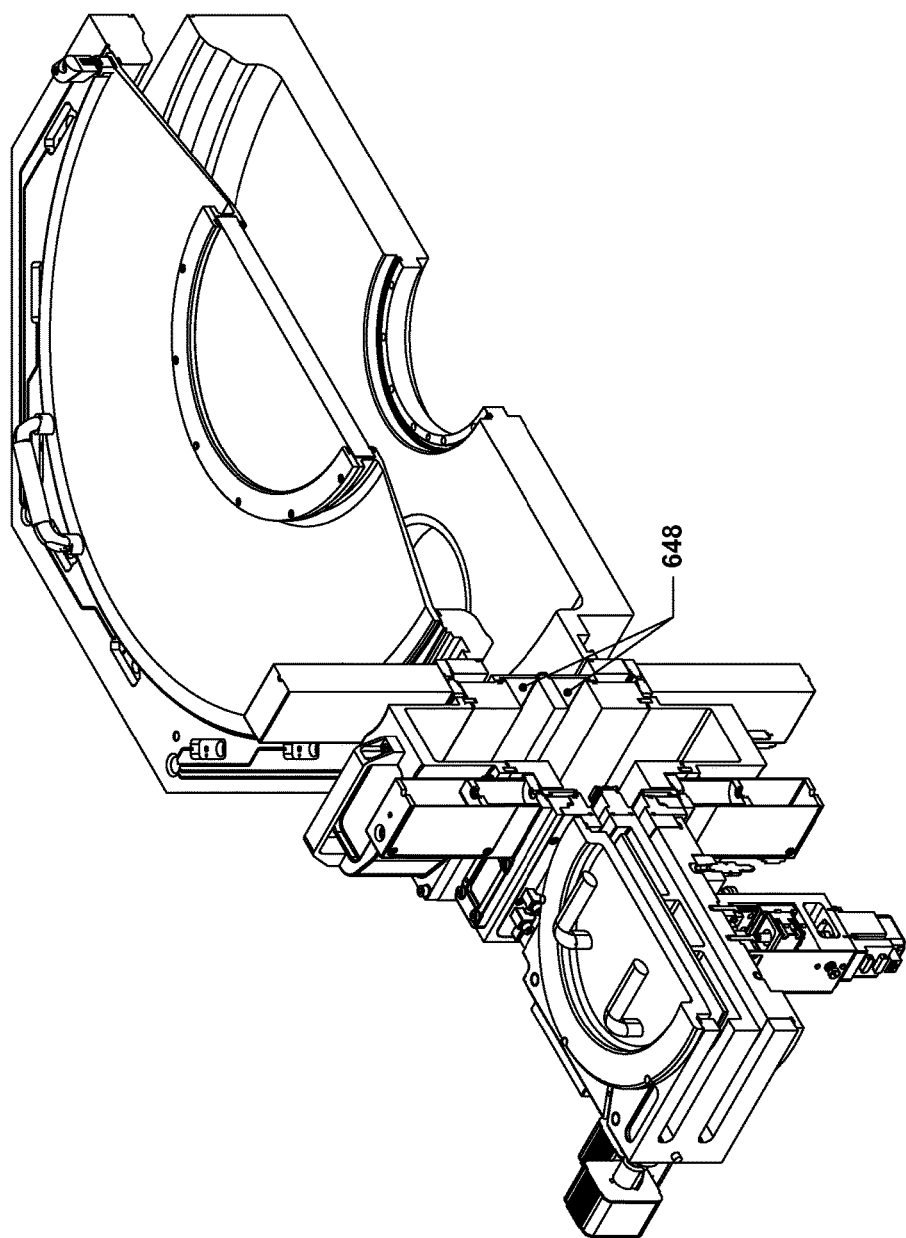
FIG. 6D depicts an isometric cutaway of the structures shown in FIG. 6A in a different configuration.

FIG. 6D depicts the same isometric cutaway view of FIG. 6C, but with the loadlock/gas expansion module valves 640 open to allow for pressure equalization between the free internal volume of the loadlock 614 and the free internal volume visible of the gas expansion module 618. Such a configuration corresponds with the configuration used in phase 224 of FIG. 2.

Figure 6E:
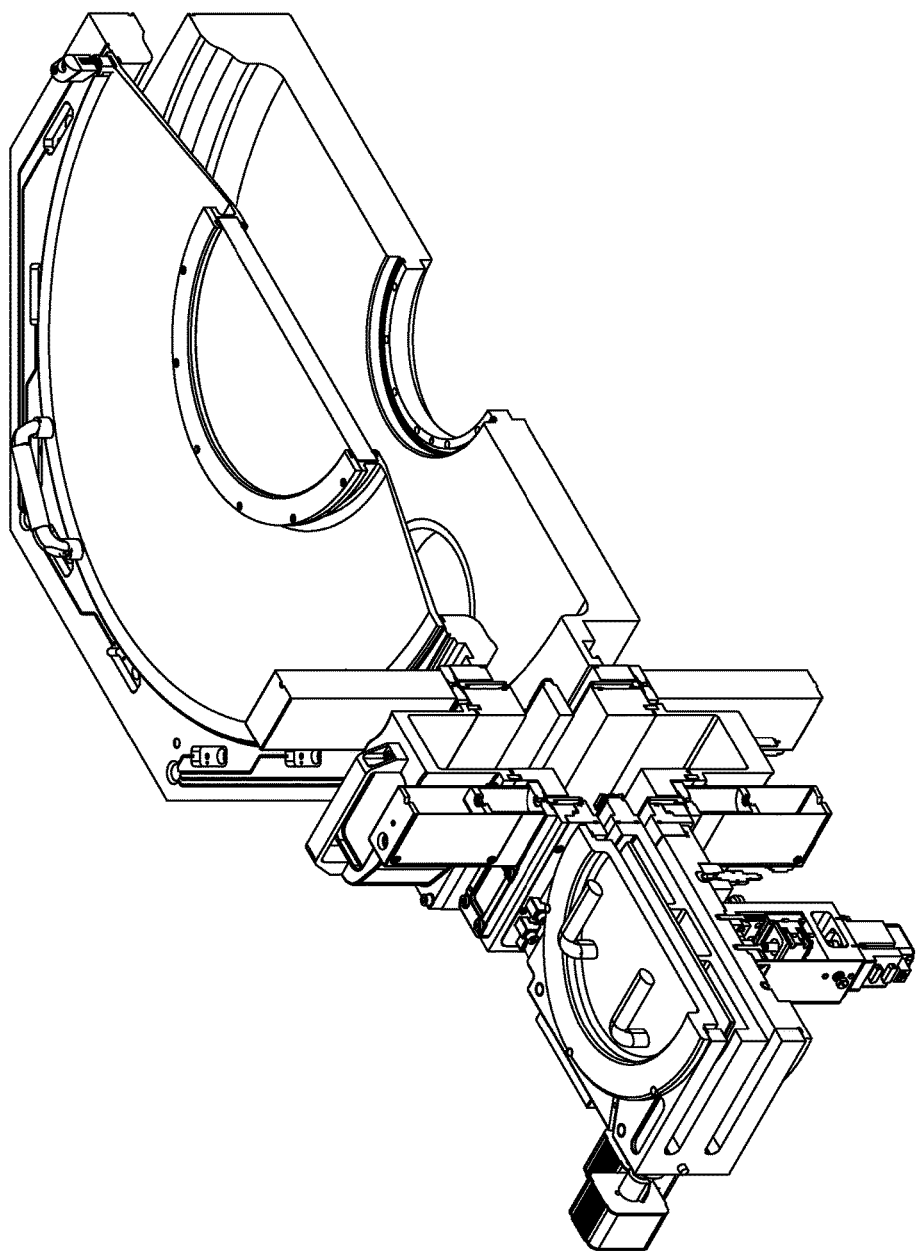
FIG. 6E depicts an isometric cutaway of the structures shown in FIG. 6A in yet another different configuration.

FIG. 6E depicts the same isometric cutaway view of FIG. 6C, but with the loadlock/gas expansion module valves 640 and the transfer chamber/gas expansion module valves 648 open to allow for fluidic communication between the internal volumes of the loadlock 614, the internal volume of the gas expansion module 618, and the internal volume of the transfer chamber 612. Such a configuration corresponds with the configuration used in phase 221 of FIG. 2.

Figure 6G:
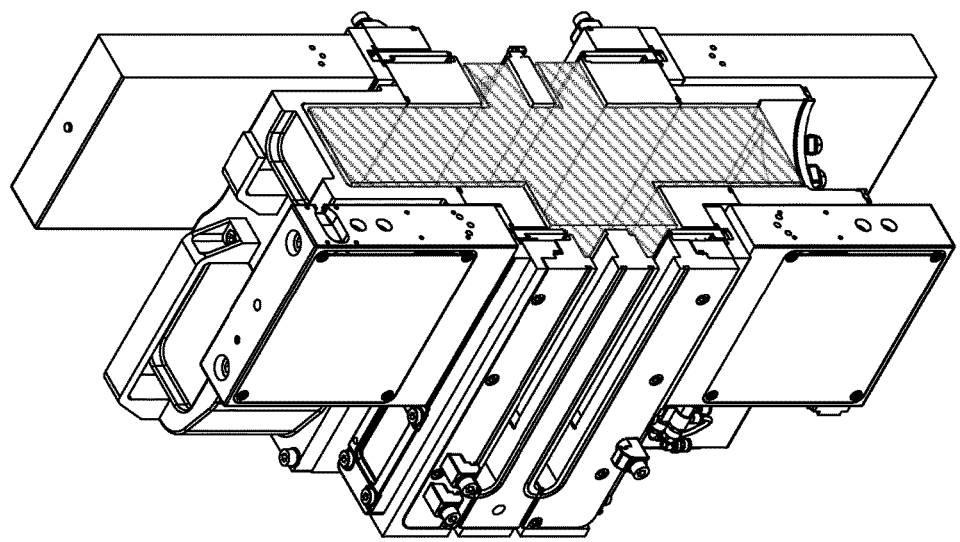
FIG. 6G depicts another off-angle cutaway of the gas expansion module of FIG. 6A.
Figure 6F:
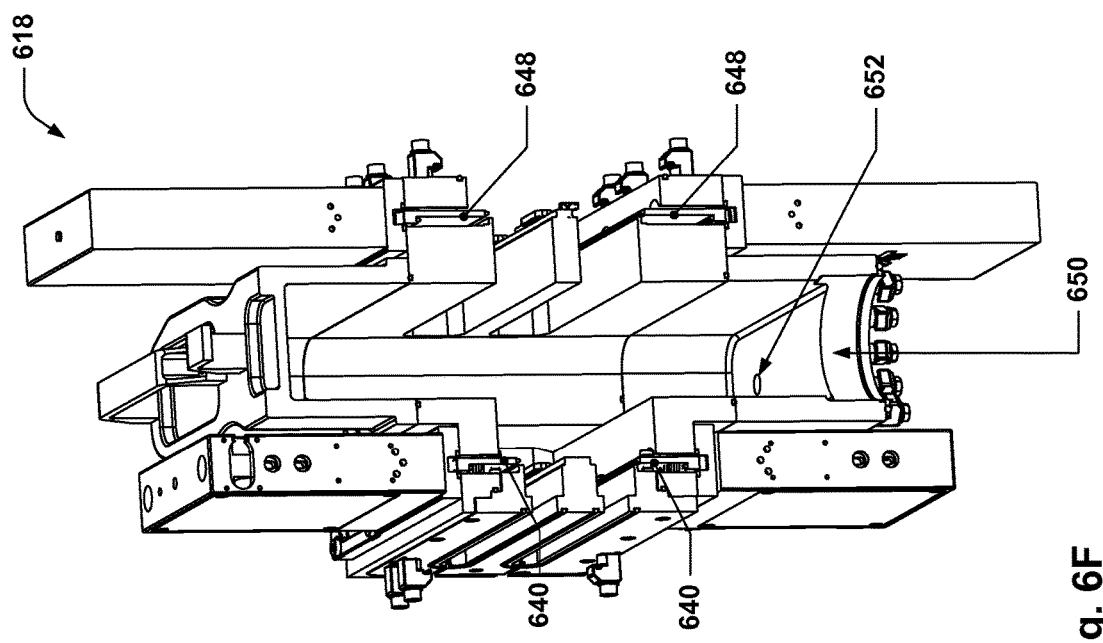
FIG. 6F depicts an off-angle cutaway of the gas expansion module of FIG. 6A.

FIGS. 6F and 6G depict off-angle sectional views of the gas expansion module 618 (sectioned through a different plane than in FIGS. 6C-6E). The loadlock/gas expansion module valves 640 and the transfer chamber/gas expansion module valves 648 are in the open position in these figures. Visible in FIG. 6F is roughing pump port 652, which may be used to connect the gas expansion module 618 to a roughing pump (not shown). Visible in FIGS. 6F and 6G is also high-vacuum pump port 650, which may be of a considerably larger diameter than roughing pump port 652. The larger diameter of high-vacuum pump port 650 may allow for enhanced pumping capability in the molecular flow regime since it is statistically more likely that a gas molecule will encounter the high-vacuum pump (not shown, by may be affixed to the high-vacuum pump port 650 directly or via a valve) due to the larger throat area provided by a large-diameter high-vacuum pump port 652. Visible in FIG. 6G is an approximation of the gas expansion volume $V_E$ (shown as a partially transparent, hatched volume—it is also sectioned in the same manner as the gas expansion module). While a larger gas expansion volume will generally produce a higher pressure drop upon equalization (the ideal case being an infinitely large gas expansion volume), practically speaking (based on packaging needs and the limitations on equipment to pump down the gas expansion volume), the gas expansion volume may typically be in the range of 1.5 to 10 times, e.g., 3 times, the internal free volume of the loadlock (or of one half of a dual-compartment loadlock).

Another aspect of a gas expansion module-equipped loadlock is that loadlocks, in themselves, are often very poor subjects for high-vacuum pumping. This is because, as noted above, the mean free path of gas molecules in the molecular flow regime is typically defined by collisions with the walls of the container holding the gas. High vacuum pumps therefore typically rely on molecules having an unobstructed path into the throat of the high vacuum pump—if other structures, such as wafer supports, obstruct such pathways, i.e., result in a low flow conductance, it is less likely that gas molecules will enter the throat. In contrast, a gas expansion module has few, if any, such obstructions, allowing for enhanced molecular flow pumping, i.e., high flow conductance.

Figure 7:
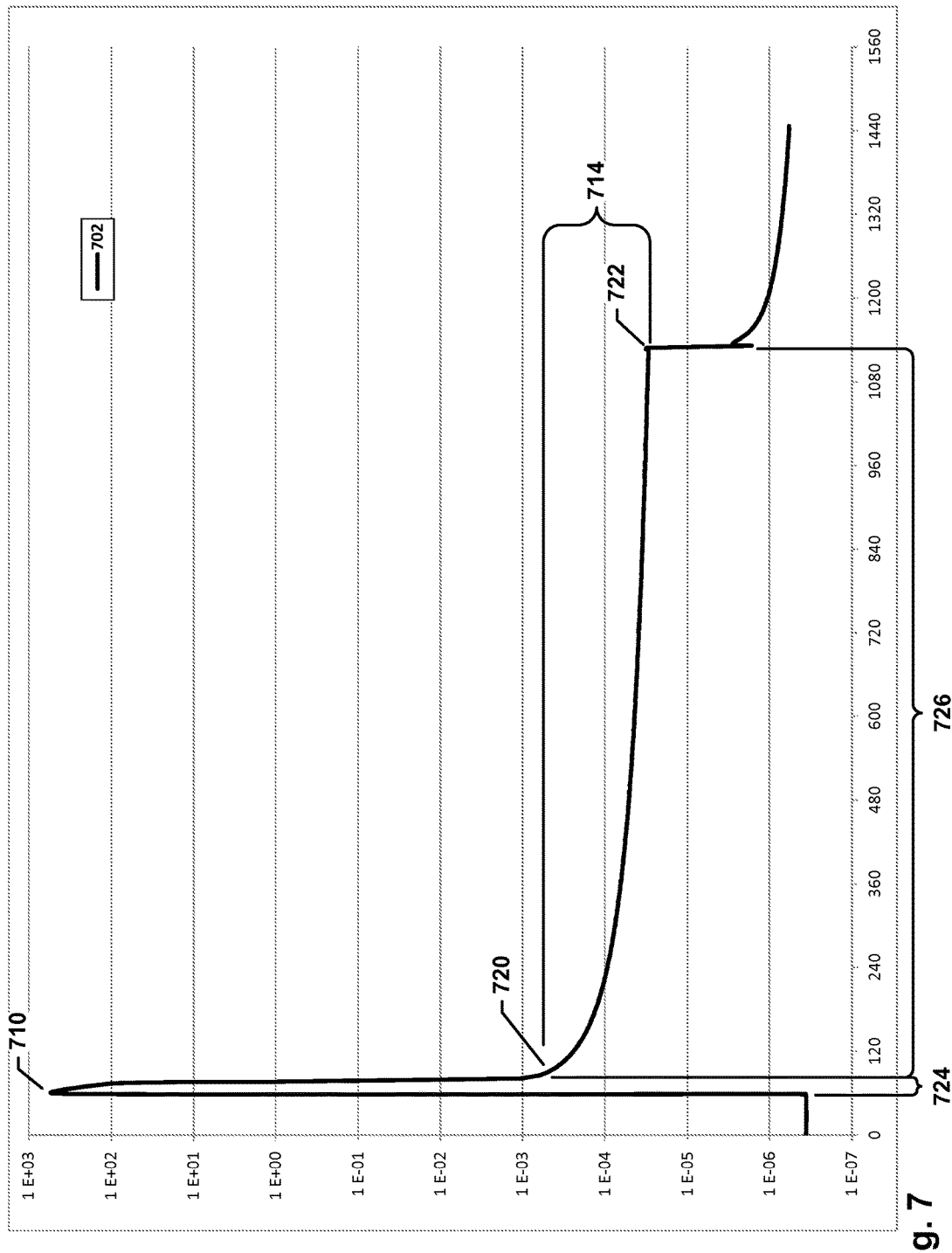
FIG. 7 is a chart showing test data showing pressure v. time for an example loadlock pumpdown without the benefit of a gas expansion module.

FIG. 7 is a chart showing test data showing pressure v. time for an example loadlock pumpdown without the benefit of a gas expansion module. A curve 702 is shown in FIG. 7 that indicates loadlock pressure as a function of time. The loadlock initially started at a very low pressure, e.g., at a vacuum with a magnitude of about 1E-06 pressure units since it was in fluid communication with a transfer chamber. The transfer chamber pressure was continuously held at a very low pressure, e.g., in the 1E-06 range, to facilitate wafer transfer between various process chambers connected with the transfer chamber. The transfer chamber was then sealed off from the loadlock volume using a slit or gate valve, and another slit or gate valve was opened in the loadlock to allow a wafer to be received from an external source, e.g., from a wafer cassette or handling system, at ambient conditions. This pressure rise was relatively instantaneous and caused the pressure in the loadlock to reach ambient conditions at 710. A wafer was then transferred into the loadlock and the loadlock was then closed. After the loadlock was sealed from the ambient environment, a roughing pump was activated during roughing pumpdown segment 724. This caused a relatively rapid decrease in pressure. When the roughing pump began to lose efficiency, e.g., around 1 milliTorr, a turbomolecular pump connected with the loadlock volume was activated to further draw down the loadlock volume pressure during turbopumping segment 726. In this example, the wafer used included substantial amounts of plastics that outgassed significant amounts of water into the loadlock volume during pumpdown. As a result, at approximately location 720, the efficiency of the turbomolecular pump decreased significantly in segment 714, lengthening the amount of time that it took for the loadlock pressure to reach the target value 722. Once the target value 722 was reached, a gate or slit valve connecting the loadlock to the wafer transfer chamber was opened, causing the loadlock pressure to drop again to reach equilibrium with the transfer chamber pressure. As can be seen, the overall time for one such cycle was approximately 1400 time units.

Figure 8:
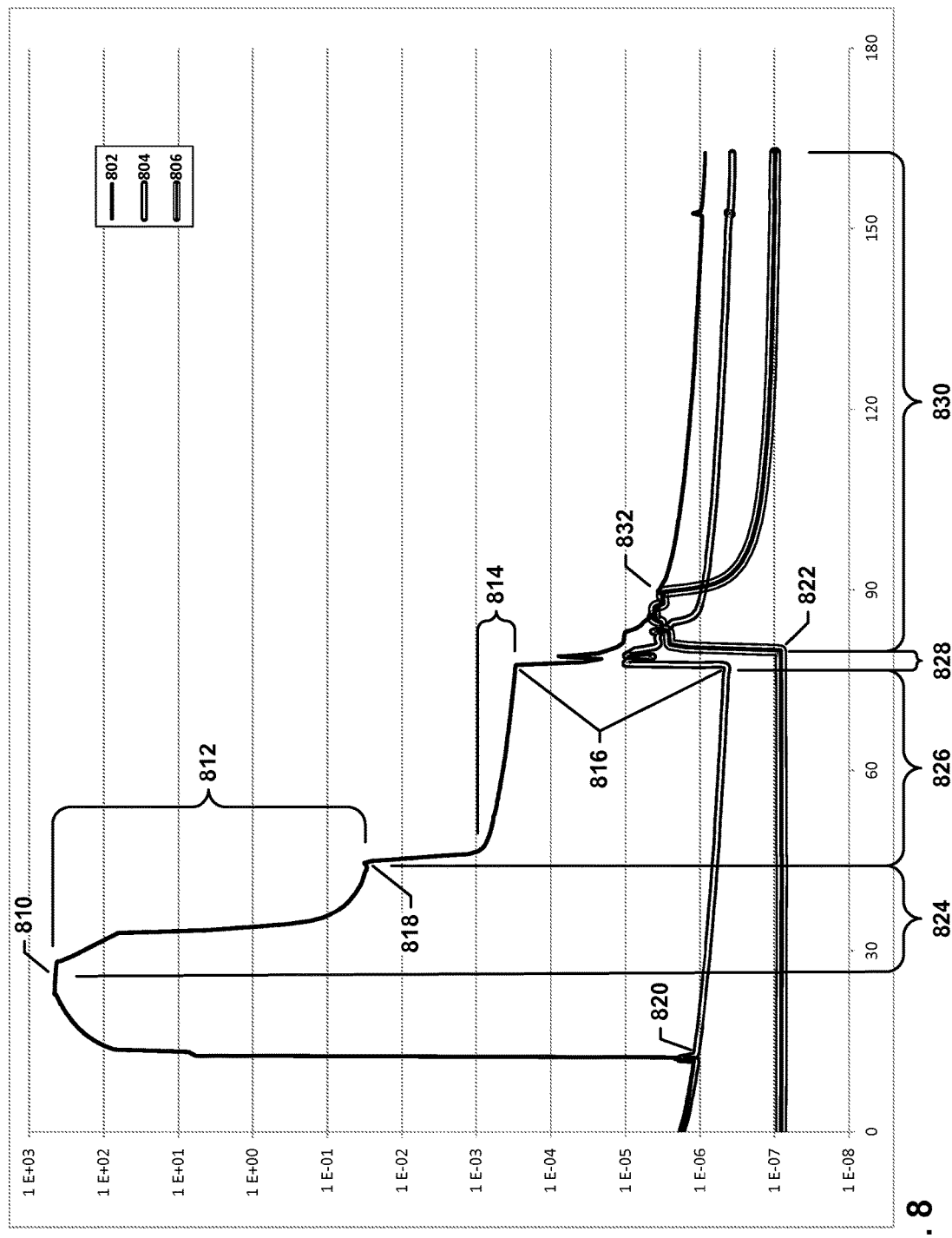
FIG. 8 is a chart showing test data showing pressure v. time for an example loadlock pumpdown with the benefit of a gas expansion module.

FIG. 8 is a chart showing test data showing pressure v. time for an example loadlock pumpdown with the benefit of a gas expansion module. The gas expansion module that was used is similar to the one shown in FIGS. 6A through 6G but also included a cryopump in fluidic communication with the gas expansion volume. In FIG. 8, three separate pressure plots are shown. Plot 802 represents the pressure in the loadlock volume; plot 804 represents the pressure in the gas expansion module/volume, and plot 806 represents the pressure in the transfer chamber.

At t=0, the loadlock volume pressure 802 and the gas expansion volume pressure 804 are the same. At point 820, a gate or slit valve connecting the loadlock volume to the gas expansion volume was closed and, shortly thereafter, another gate or slit valve was opened in the loadlock to allow a wafer to be received from an external source, e.g., from a wafer cassette or handling system, at ambient pressure 810. After wafer loading was complete, the loadlock was resealed and a rough pump engaged to evacuate gas from within the loadlock volume during rough pumping segment 824.

At point 818, the rough pump efficiency had decreased, and a turbomolecular pump was engaged to draw the pressure in the loadlock down further during turbopumping segment 826. During these operations, e.g., during segments 824 and 826, the gas expansion volume was pumped down through the use of a second turbopump (due to the low pressure that the gas expansion valve typically stayed at in this implementation, the gas expansion volume was not equipped with a roughing pump). The wafer used to obtain the test data of FIG. 8 also included substantial amounts of plastics that outgassed significant amounts of water during pumpdown; as can be seen, this resulted in the turbopumping efficiency decreasing during portion 814 of the turbopumping segment 826.

At points 816, a gate or slit valve sealing the gas expansion volume off from the loadlock volume was opened, and the loadlock volume and the gas expansion volume were fluidly joined, causing the loadlock pressure to drop suddenly and the gas expansion volume pressure to rise suddenly. As can be seen, the loadlock pressure dropped to a value substantially commensurate with point 722 in FIG. 7 during equalization segment 828. Notably, the time required to decrease the loadlock pressure from approximately 2.5E-4 pressure units to 2.5E-5 pressure units in the gas expansion module-equipped test tool of FIG. 8 was significantly shorter, e.g., on the order of 1-3 time units, than the time required to effect the same decrease in pressure in the test tool of FIG. 7, e.g., on the order of 1000 units. After the loadlock volume and the gas expansion volume had been fluidly joined and the loadlock pressure had dropped further, a chamber gate or slit valve was opened at point 822 to allow the loadlock volume, the gas expansion volume, and the chamber to be fluidly connected. Between points 822 and 832, the wafer was transferred from the loadlock, through the gas expansion module, and into the chamber. At point 832, the chamber gate or slit valve was re-sealed.

In this example, the turbomolecular pump for the gas expansion volume was kept running continuously (as opposed to being started/stopped) since the gas expansion module was held at a pressure in the high-vacuum regime throughout the entire cycle. Moreover, the cryopump in the gas expansion volume was also kept running continuously to assist in removing gas from the gas expansion volume, particularly water outgassing from the wafer.

Figure 9:
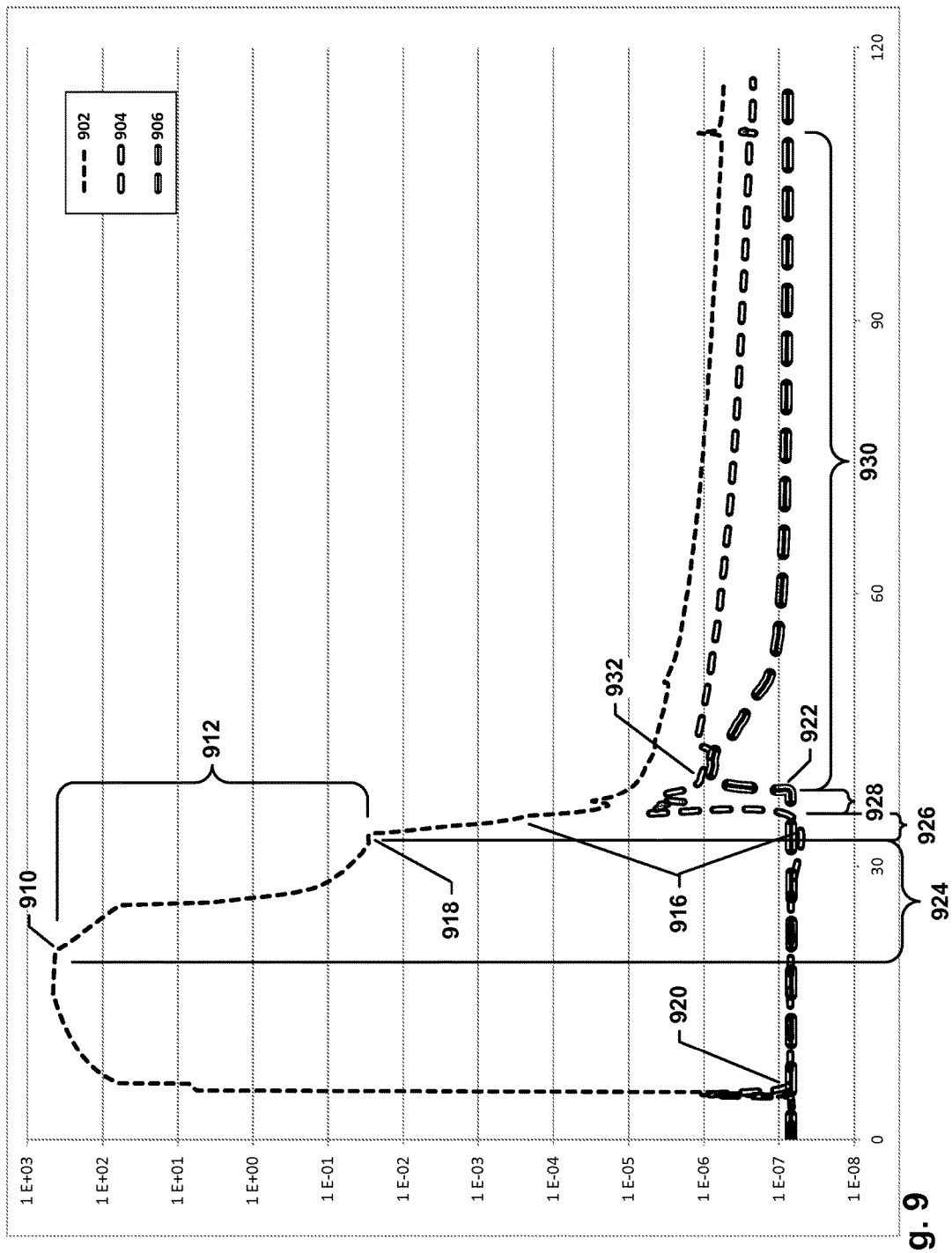
FIG. 9 is a chart showing test data showing pressure v. time for another example loadlock pumpdown with the benefit of a gas expansion module.

FIG. 9 is a chart showing test data showing pressure v. time for another example loadlock pumpdown with the benefit of a gas expansion module. In this example, the wafer used was a typical silicon wafer and did not contain substantial amounts of plastics. As a result, the water outgassing behavior reflected in FIGS. 7 and 8 is not reflected in FIG. 9. The equipment used was the same as the equipment used for the dataset of FIG. 8.

As with FIG. 8, FIG. 9 depicts three separate data sets. Plot 902 represents the pressure in the loadlock volume; plot 904 represents the pressure in the gas expansion module/volume, and plot 906 represents the pressure in the transfer chamber.

At t=0, the loadlock volume pressure 902 and the gas expansion volume pressure 904 are the same. At point 920, a gate or slit valve connecting the loadlock volume to the gas expansion volume was closed and, shortly thereafter, another gate or slit valve was opened in the loadlock to allow a wafer to be received from an external source, e.g., from a wafer cassette or handling system, at ambient pressure 910. After wafer loading was complete, the loadlock was resealed and a rough pump engaged to evacuate gas from within the loadlock volume during rough pumping segment 924.

At point 918, the rough pump efficiency began to drop off, and a turbomolecular pump was engaged to draw the pressure in the loadlock down further. During these operations, e.g., during segments 924 and 926, the gas expansion volume was pumped down through the use of a turbopump (due to the low pressure that the gas expansion valve typically stayed at in this implementation, the gas expansion volume was not equipped with a roughing pump) during turbopumping segment 926. At points 916, a gate or slit valve sealing the gas expansion volume off from the loadlock volume was opened, and the loadlock volume and the gas expansion volume were fluidly joined, causing the loadlock pressure to drop suddenly and the gas expansion volume pressure to rise suddenly. As can be seen, the loadlock pressure dropped to a value substantially commensurate with point 722 in FIG. 7 during equalization segment 928.

Again, the time required to decrease the loadlock pressure from approximately 2.5E-4 pressure units to 2.5E-5 pressure units in the gas expansion module-equipped test tool of FIG. 9 was significantly shorter, e.g., on the order of 1-3 time units, than the time required to effect the same decrease in pressure in the test tool of FIG. 7, e.g., on the order of 1000 units. After the loadlock volume and the gas expansion volume had been fluidly joined and the loadlock pressure had dropped further, a chamber gate or slit valve was opened at point 922 to allow the loadlock volume, the gas expansion volume, and the chamber to be fluidly connected. Between points 922 and 932, the wafer was transferred from the loadlock, through the gas expansion module, and into the chamber. At point 932, the chamber gate or slit valve was re-sealed.

It is to be understood that the data shown in FIGS. 7 through 9 was experimental data, and that, due to various factors such as pressure sensor location, pressure sensor type, localized pressure environments, high-vacuum conditions, etc., the data may exhibit some unexpected behavior. For example, in FIG. 8 at points 816, the gas expansion volume and the loadlock volume were fluidly joined by opening a gate or slit valve separating the two volumes, allowing the gases within each volume to mix and reach equilibrium. While one would expect that the pressures within these two volumes would equalize, the data plots within the segment 830 seem to indicate that the pressures within these two volumes are slightly different.

As mentioned above, this may be due to a variety of factors, e.g., due to the high-vacuum environment, equalization of pressures between two widely-separated but fluidly joined volumes may take some time. Additionally, there may be localized pressure sources present in some areas that result in pressure imbalances. For example, materials released from the wafer in the loadlock may have contaminated the walls of the loadlock and may release gas even after the wafer has been transferred out of the loadlock.

Regardless of such behavior, the overall principle behind the operation of a gas expansion module is demonstrated in the charted data. As can be seen, a dramatic decrease in loadlock pressure can be provided through the use of a gas expansion module, significantly reducing the overall pumpdown time required for a given loadlock.

Generally speaking, the use of a gas expansion volume in conjunction with a loadlock may drastically reduce the cycle time needed to reduce the pressure in the loadlock after introducing a semiconductor wafer to the loadlock under atmospheric or near-atmospheric conditions. Such time reductions may, as demonstrated in the previously-discussed data, reduce the cycle time on the order of a hundredfold or a thousandfold. This may reduce or eliminate the impact of loadlock cycle times on various semiconductor processes.

Such gas-expansion volume-equipped loadlocks may be used with loadlocks sized for any wafer size, but may provide particular advantages with increasing wafer size.

For example, as standard wafer diameters increase from 300 mm to 450 mm, as is expected to occur in the near future within the industry, loadlock volumes may, simply due to the increase in wafer diameter, experience a working volume increase on the order of 125% or greater (as compared with the 50% increase in wafer diameter). Thus, loadlocks for larger wafers, e.g., 450 mm wafers, may exhibit even longer pump-down times than the current 300 mm-sized loadlocks, e.g., a 125% increase in pump-down time, unless such loadlocks are modified, for example, to accommodate gas expansion volumes such as disclosed herein.

Another benefit of using gas-expansion volume-equipped loadlocks may be seen in the context of handling semiconductor wafers that include a substantial amount of epoxy or other material that has a tendency to outgas. For example, epoxy-based wafers or packaging solutions may outgas, e.g., release gases including water content, when exposed to a low-pressure environment. This has two effects—the first is that the released gas may contaminate the loadlock environment with, for example, water vapor. The second is that the released gas acts to drive up the pressure in the loadlock (similar to how a leak in the loadlock might allow gas from outside of the loadlock to seep into the loadlock and make it difficult to achieve a desired low pressure). A gas-expansion volume may not prevent such outgassing, but it may offer the capability of overcoming the pressure rise in a much quicker fashion than mere pumping alone may offer. Additionally, a gas-expansion volume with a cryopump may be used to rapidly condense any water vapor out of the air within the loadlock, thus reducing water contamination.

While the implementations shown in the Figures herein and discussed above are directed at gas expansion volumes connected with loadlocks, similar structures could also be used in other semiconductor processing scenarios. For example, a gas expansion volume could be coupled with a process chamber volume in order to more rapidly evacuate process gases remaining after (or during) a semiconductor processing cycle within the chamber. Additionally, it may be envisioned that with appropriate valving, an expansion chamber may be used adjacent to a process chamber to reclaim reagent material/process gases, and then re-introduce such reclaimed material at a subsequent step/time in the semiconductor fabrication process.

Another aspect of the disclosure is an apparatus configured to accomplish the methods described herein. A suitable apparatus includes hardware for accomplishing the process operations, such as the gas expansion modules, valving, pistons, loadlocks, and/or other components described above, and a system controller having instructions for controlling those components to perform operations in accordance with the present disclosure. The system controller will typically include one or more memory devices and one or more processors configured to execute the instructions so that the apparatus will perform a method in accordance with the present disclosure, e.g., open/close gate valves, activate/deactivate roughing and high-vacuum pumps, take pressure measurements of the gas expansion volume or the loadlock volume to determine when to open various valves, etc. Machine-readable media containing instructions for controlling process operations in accordance with the present disclosure may be coupled to the system controller.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

It will also be understood that unless features in any of the particular described implementations are expressly identified as incompatible with one another or the surrounding context implies that they are mutually exclusive and not readily combinable in a complementary and/or supportive sense, the totality of this disclosure contemplates and envisions that specific features of those complementary implementations can be selectively combined to provide one or more comprehensive, but slightly different, technical solutions. It will therefore be further appreciated that the above description has been given by way of example only and that modifications in detail may be made within the scope of the disclosure.

What is claimed is:

1. An apparatus configured to be installed as part of a semiconductor processing tool, the semiconductor processing tool selected from the group consisting of: a semiconductor processing tool having one or more process chambers and a loadlock with a loadlock volume, and a semiconductor processing tool having one or more process chambers, a loadlock with a loadlock volume, and one or more transfer chambers, the apparatus comprising:

a housing having internal surfaces defining a gas expansion volume, wherein the gas expansion volume is at least one and a half times larger than the loadlock volume;

a gas expansion volume valve, wherein:
the housing is configured to connect with the loadlock such that the gas expansion volume valve is interposed between the loadlock volume and the gas expansion volume when so connected,
the gas expansion volume is configured to be separate from the one or more process chambers and separate from any transfer chamber of the semiconductor processing tool,
the gas expansion volume valve is configured to be movable between an open state and a closed state,
the gas expansion volume valve permits fluidic communication between the loadlock volume and the gas expansion volume when in the open state and when the apparatus is connected with the loadlock, and
the gas expansion volume valve prevents fluidic communication between the loadlock volume and the gas expansion volume when in the closed state and when the apparatus is connected with the loadlock;

a first mechanism that comprises a high-vacuum pump configured to evacuate gas from the housing regardless of whether the gas expansion volume valve is in the open state or the closed state; and a controller with at least one processor and a memory, the memory storing computer-executable instructions for controlling the at least one processor to:
a) control the gas expansion volume valve to enter the closed state;

b) cause the loadlock to be fluidically isolated from the one or more process chambers;

c) control a roughing pump to, after (a) and (b), evacuate gas from within the loadlock volume to reach a first lower-than-atmospheric pressure when the gas expansion volume valve is in the closed state;

d) control, after (a), the high-vacuum pump to evacuate gas from within the housing to reach a second lower-than-atmospheric pressure, wherein the second lower-than-atmospheric pressure is lower than the first lower-than-atmospheric pressure; and e) control, after (c) and (d), the gas expansion valve to enter the open state thereby allowing gas in the gas expansion volume to mix with gas from the loadlock volume and reach equilibrium, wherein:
the first mechanism is fluidically connected with the gas expansion volume,
the first mechanism is configured to control gas pressure within the housing and to cause the pressure in the housing to be reducible to lower than 10E-3 Torr, and
the first mechanism is fluidically isolated from the loadlock volume when the gas expansion volume valve is in the closed state and when the apparatus is connected with the loadlock.

2. The apparatus of claim 1, further comprising a chamber valve, wherein:
the chamber valve is configured to seal the chamber port off from the loadlock volume and the gas expansion volume when the chamber valve is closed and the gas expansion volume valve is open, and
the gas expansion volume is configured to connect with one of the process chambers such that:
the chamber valve is interposed between the housing and a chamber selected from the group consisting of: a) one of the one or more process chambers of the semiconductor processing tool having one or more process chambers and b) one of the one or more transfer chambers of the semiconductor processing tool having one or more process chambers and one or more transfer chambers when so connected, and
gas flowing from the one of the process chambers or one of the transfer chambers to the loadlock volume must pass through at least part of the gas expansion volume before reaching the loadlock volume when the apparatus is connected with the loadlock.

3. The apparatus of claim 1, wherein:
the first lower-than-atmospheric pressure is between about 10 Torr and 1 milliTorr, and
the second lower-than-atmospheric pressure is lower than about 10E-3 Torr.

4. The apparatus of claim 1, wherein:
the apparatus is configured to be installed as part of a semiconductor processing tool that has a transfer chamber that is interposed between the loadlock and the one or more process chambers such that gas flowing from the gas expansion volume or the loadlock to the or more process chambers must pass through at least a part of the transfer chamber before reaching the one or more process chambers, and that is configured to be fluidically isolated from the loadlock and the gas expansion volume, and
the memory storing further instructions for controlling the at least one processor to in (b) cause the loadlock to be fluidically isolated from the transfer chamber.

5. An apparatus configured to be installed as part of a semiconductor processing tool, the semiconductor processing tool selected from the group consisting of: a semiconductor processing tool having one or more process chambers, and a semiconductor processing tool having one or more process chambers and one or more transfer chambers, the apparatus comprising:
one or more housings with internal surfaces defining a) a loadlock volume and b) a gas expansion volume, wherein the gas expansion volume is at least one and a half times larger than the loadlock volume;
a chamber port configured to be fluidically connected to a chamber selected from the group consisting of: a) one of the one or more process chambers of the semiconductor processing tool having one or more process chambers and b) one of the one or more transfer chambers of the semiconductor processing tool having one or more process chambers and one or more transfer chambers;
a gas expansion volume valve interposed between the loadlock volume and the gas expansion volume;
a chamber valve configured to seal the chamber port off from the loadlock volume and the gas expansion volume when the chamber valve is closed and the gas expansion volume valve is open;
a first mechanism that comprises a high-vacuum pump configured to evacuate gas from the gas expansion volume of the one or more housings regardless of whether the gas expansion volume valve is in the open state or the closed state;
a loadlock valve connected to the loadlock volume;
a second mechanism configured to control pressure in the loadlock volume; and
a controller with at least one processor and a memory, the memory storing computer-executable instructions for controlling the at least one processor to:
a) control the gas expansion volume valve and the chamber valve to enter the closed state;
b) control, after (a), the loadlock valve to enter an open state to allow a semiconductor wafer to be placed within the loadlock volume and to enter a closed state after the semiconductor wafer has been placed within the loadlock volume;
c) control, after (b), the second mechanism to reduce gas pressure in the loadlock volume to a first low pressure;
d) control, after (a), the first mechanism to reduce gas pressure in the gas expansion volume to a second low pressure lower than the first low pressure;
e) control, after (c) and (d), the gas expansion volume valve to enter the open state, thereby allowing gas remaining in the gas expansion volume and the loadlock volume to mix and reach equilibrium at a third low pressure between the first low pressure and the second low pressure; and
f) control, after (e), the chamber valve to enter the open state, thereby causing the loadlock volume and the chamber port to be fluidically connected with one another, wherein:
the gas expansion volume valve and the chamber valve are configured such that the loadlock volume, the gas expansion volume, and the chamber port are fluidically connected with one another when the gas expansion volume valve and the chamber valve are in an open state and the loadlock volume, the gas expansion volume, and the chamber port are sealed off from one another when the gas expansion volume valve and the chamber valve are in a closed state, the gas expansion volume is configured to be separate from the chambers selected from the group consisting of: a) the one or more process chambers of the semiconductor processing tool having one or more process chambers and b) the one or more process chambers and the one or more transfer chambers of the semiconductor processing tool having one or more process chambers and one or more transfer chambers, the first mechanism is fluidically connected with the gas expansion volume, the first mechanism is configured to control gas pressure within the gas expansion volume of the one or more housings and to cause the pressure in the gas expansion volume of the one or more housings to be reducible to lower than 10E-3 Torr, and the first mechanism is fluidically isolated from the loadlock volume when the gas expansion volume valve is in the closed state and when the gas expansion volume of the one or more housings is connected with the loadlock.

6. The apparatus of claim 5, wherein the chamber valve is interposed between the chamber port and the one or more housings with internal surfaces defining the gas expansion volume such that gas flowing from the chamber port to the loadlock volume must pass through the before reaching the loadlock volume.

7. The apparatus of claim 5, wherein the chamber valve is interposed between the chamber port and the loadlock volume such that gas flowing from the chamber port to the gas expansion volume must pass through the loadlock volume before reaching the gas expansion volume.

8. The apparatus of claim 5, wherein:
the first low pressure is lower than about 10E-6 Torr, and
the second low pressure is between about 10 Torr and 1 milliTorr.

9. The apparatus of claim 5, wherein:
the second mechanism comprises a roughing pump configured to evacuate gas from within the loadlock volume, wherein the roughing pump is fluidically isolated from the gas expansion volume and the chamber port when the gas expansion volume valve and the chamber valve are in the closed state; and
the first mechanism comprises a turbopump.

10. A method for operating an apparatus including a housing having internal surfaces defining a gas expansion volume, a chamber port, a loadlock with a loadlock volume, a gas expansion volume valve, a chamber valve, and a loadlock valve, wherein:
the apparatus is configured to be installed as part of a semiconductor processing tool, the semiconductor processing tool selected from the group consisting of: a semiconductor processing tool having one or more process chambers, and a semiconductor processing tool having one or more process chambers and one or more transfer chambers,
the gas expansion volume is at least one and a half times larger than the loadlock volume,
the gas expansion volume valve and the chamber valve are configured such that the loadlock volume, the gas expansion volume, and the chamber port are fluidically connected with one another when the gas expansion volume valve and the chamber valve are in an open state, the loadlock volume, the gas expansion volume, and the chamber port are sealed off from one another when the gas expansion volume valve and the chamber valve are in a closed state, the loadlock valve is interposed between the loadlock volume and an interface configured to receive a semiconductor wafer from an external source, the chamber port is configured to be fluidically connected to a chamber selected from the group consisting of: a) one of the one or more process chambers of the semiconductor processing tool having one or more process chambers and b) one of the one or more transfer chambers of the semiconductor processing tool having one or more process chambers and one or more transfer chambers, the gas expansion volume valve is interposed between the loadlock volume and the gas expansion volume, the chamber valve is configured to seal the chamber port off from the loadlock volume and the gas expansion volume when the chamber valve is closed and the gas expansion volume valve is open, the gas expansion volume valve and the chamber valve are configured such that the loadlock volume, the gas expansion volume, and the chamber port are fluidically connected with one another when the gas expansion volume valve and the chamber valve are in an open state and the loadlock volume, the gas expansion volume, and the chamber port are sealed off from one another when the gas expansion volume valve and the chamber valve are in a closed state, and the gas expansion volume is configured to be separate from the chambers selected from the group consisting of: a) the one or more process chambers of the semiconductor processing tool having one or more process chambers and b) the one or more process chambers and the one or more transfer chambers of the semiconductor processing tool having one or more process chambers and one or more transfer chambers, the method comprising:

a) controlling the gas expansion volume valve and the chamber valve to enter the closed state;
b) controlling, after (a), the loadlock valve to enter an open state;
c) placing, after (b), a semiconductor wafer into the loadlock via the loadlock valve;
d) controlling, after (c), the loadlock valve to enter the closed state;
e) decreasing, after (d), pressure within the loadlock volume to reach a first low pressure;
f) decreasing, after (a), pressure within the gas expansion volume to reach a second low pressure lower than the first low pressure;
g) controlling, after (e) and (f), the gas expansion volume valve to enter the open state, thereby allowing gas remaining in the gas expansion volume and the loadlock volume to mix and reach equilibrium at a third low pressure between the first low pressure and the second low pressure;
h) controlling, after (g), the chamber valve to enter the open state, thereby causing the loadlock volume and the chamber port to be fluidly connected with one another; and
i) moving, after (h), the semiconductor wafer out of the loadlock volume via the chamber port.

11. The method of claim 10, wherein:
(e) is performed by evacuating gas from within the loadlock volume using a roughing pump to reach the first low pressure, and
(f) is performed by evacuating gas from within the gas expansion volume using a high-vacuum pump to reach the second low pressure.

12. The method of claim 10, further comprising:
j) condensing gas within the gas expansion volume using a cryopump at least during (f).

13. The method of claim 10, wherein:
(e) is performed by evacuating gas from within the loadlock volume using a roughing pump to reach the first low pressure, and
(f) is performed by expanding the gas expansion volume to be at least one and a half times larger than the loadlock volume.

\* \* \* \* \*